United States Patent [19]
Rostoker et al.

[11] Patent Number: 5,780,928
[45] Date of Patent: Jul. 14, 1998

[54] ELECTRONIC SYSTEM HAVING FLUID-FILLED AND GAS-FILLED THERMAL COOLING OF ITS SEMICONDUCTOR DEVICES

[75] Inventors: Michael D. Rostoker, Boulder Creek; Mark R. Schneider, San Jose; Nicholas F. Pasch, Pacifica, all of Calif.

[73] Assignee: LSI Logic Corporation, Milpitas, Calif.

[21] Appl. No.: 631,704

[22] Filed: Apr. 9, 1996

Related U.S. Application Data

[63] Continuation-in-part of Ser. No. 207,493, Mar. 7, 1994.
[51] Int. Cl.$^6$ ............................................. H01L 23/34
[52] U.S. Cl. .......................... 257/713; 257/714; 257/715
[58] Field of Search ........................................ 257/713–15

[56] References Cited

U.S. PATENT DOCUMENTS

| | | | |
|---|---|---|---|
| 3,596,228 | 7/1971 | Reed, Jr. et al. | 339/59 |
| 3,826,957 | 7/1974 | McLaughlin et al. | 257/715 |
| 4,012,770 | 3/1977 | Pravda et al. | 257/715 |
| 4,730,665 | 3/1988 | Cutchaw | 257/714 |
| 4,912,548 | 3/1990 | Shanker et al. | 257/715 |
| 5,270,572 | 12/1993 | Nakajima et al. | 257/714 |
| 5,349,237 | 9/1994 | Sayka et al. | 257/715 |
| 5,436,501 | 7/1995 | Ikeda | 257/714 |

*Primary Examiner*—Mahshid D. Saadat
*Assistant Examiner*—T. M. Arroyo
*Attorney, Agent, or Firm*—Katz & Cotton, LLP

[57] ABSTRACT

An electronic system having improved thermal transfer from a semiconductor die in a semiconductor device assembly (package) by at least partially filling a cavity in the package with a thermally conductive fluid, immersing a heat collecting portion of a heat pipe assembly into the fluid, and sealing the cavity. In order that the thermally conductive fluid does not chemically attack the die or its electrical connections, the die and connections can be completely covered with an encapsulating coating of an inorganic dielectric material, such as silicon dioxide, by any of a variety of techniques. The heat pipe provides highly efficient heat transfer from within the package to an external heat sink by means of an evaporation-condensation cooling cycle. The optional dielectric coating over the die permits selection of the thermally conductive fluid from a wider range of fluids by isolating the die and its electrical connections from direct contact with the fluid. In another embodiment, an absorptive wick is disposed within the package to transport condensed coolant to close proximity with the die. A heat pipe and wick may be employed in combination, and the heat pipe may have hollow fins, and the wick may extend into the fins (as well as into the package cavity). The use of a wick improves the thermal characteristics of the packaged device irrespective of its physical orientation.

21 Claims, 17 Drawing Sheets

ELECTRONIC SYSTEM HAVING FLUID-FILLED AND GAS-FILLED THERMAL COOLING OF ITS SEMICONDUCTOR DEVICES

CROSS REFERENCE TO RELATED PATENT APPLICATION

This patent application is a continuation-in-part of commonly owned U.S. patent application Ser. No. 08/207,493, filed Mar. 7, 1994; and is related to commonly owned U.S. patent application Ser. Nos. 08/142,674, filed Oct. 26, 1993, now U.S. Pat. No. 5,405,808, issued Apr. 11, 1995; 08/335, 174, filed Nov. 7, 1994; and 08/327,035, filed Oct. 21, 1994, all incorporated by reference herein.

BACKGROUND OF THE INVENTION

1. Field of the Invention

The present invention relates to electronic systems having techniques for dissipating heat from semiconductor devices of the system.

2. Description of the Related Technology

Electronic systems utilizing semiconductor devices such as integrated circuits have revolutionized the way modern society works and lives by making possible a level of technological sophistication unknown in the days of vacuum tubes and even discrete transistors. These electronic systems, which are building blocks for ever larger and more complex systems such as machines used in manufacture, transportation and the like. The sophistication of these electronic systems is the result of the complex functions handled by semiconductor devices (integrated circuits) making up the electronic system. An integrated circuit may comprise, on a small silicon chip, many thousand or even a million or more transistors, including associated diodes, resistors and capacitors, interconnected together to form complex electronic functions.

As used herein, a "semiconductor device" is a silicon, integrated circuit (IC) chip (die) containing circuit elements. A "semiconductor device assembly" or "semiconductor device package" is a silicon chip contained within a package and connected (wired or bonded) to conductive leads (or the like) which exit (or are disposed on a surface of) the package.

Modern integrated circuits generally provide a silicon based semiconductor die in some form of package, protecting the delicate semiconductor die inside, making it practical to handle, and providing external connections thereto. Many different types of packages are commonly provided, using many different packaging techniques and materials.

Integrated circuit (semiconductor) dies are generally connected to "conductive lines" (e.g., conductive leads on a leadframe, or conductive traces on a substrate such as a printed circuit board substrate or a ceramic layer). The connection of die to conductive lines is made by "bonding means", which includes bond pads on the die, and either bond wires between the bond pads and the conductive lines, or solder, gold or other conductive bumps or balls on the bond pads and/or conductive lines (e.g., conductive leads).

Bond wires, for example, can be made of aluminum, gold or the like, and are on the order of 0.001 inch or less in diameter. Such fine wires are, evidently, very delicate, and require protection from damage or shorting. Moisture and other environmental factors can affect the quality of the connection made by the bond wires by attacking either the "bond" (connection) itself, or by corroding the bond wire, thereby increasing its resistance.

Solder, gold and other conductive (e.g., polymeric) bumps are typically employed in connecting the die to a leadframe, such as in Tape-Automated Bonding (TAB), or in connecting a die to a substrate by "flip-chip" technologies.

Semiconductor (integrated circuit) dies are "hygroscopic", that is, they have an affinity for moisture. The absorbed moisture can attack the circuit elements on the die, adversely affecting their performance. Another sensitive area on integrated circuit dies is the area around the bond pads. Moisture can enter the die via the bond pads, or can attack the material (usually aluminum) of the bond pad itself. Hence, it is desirable to protect dies from exposure to moisture, in other words, to hermetically encapsulate the dies.

One way of protecting dies from adverse environmental degradation is to provide a moisture-free environment for the die from the time it is manufactured (fabricated, circuit elements formed on the die) until the time that it is eventually packaged. Once the die is packaged, continued protection is afforded only by the quality of the package itself.

The protection against moisture afforded the integrated circuit die and its connections (e.g., bond wires) by the package varies according to package type. While most packages do a fairly good job of protecting the die from physical damage that might occur from handling, flexing, mechanical shock, impact, or shorting. One area where packages vary widely is in their ability to provide an effective moisture barrier.

For example, integrated circuit dies are sometimes assembled to a printed circuit board (PCB) substrate. The substrate may be based on materials such as FR4 or BT resin, or Teflon (TM). PCB substrates tend to be relatively inexpensive, but are relatively porous and will allow moisture access to the die (or dies). For background purposes, a PCB substrate is typified by conductive traces on one surface, and a die-receiving area defined by inner ends of the traces. The die is mounted to the die-receiving area and is connected to the inner ends of the traces. An encapsulant, such as plastic or epoxy is formed over the die and the inner ends of the conductive traces. Bond wires and or conductive bumps/balls may also be used to connect the die to the traces. External connections to the package may be made by leads, pins or ball bumps.

Plastic (e.g., molded) and epoxy packages are also relatively inexpensive, but fail to provide an optimal moisture-resistant package for semiconductor dies. For background purposes, a plastic molded package is typified by a relatively rigid leadframe with several conductive leads and a die paddle. The die is mounted to the die paddle and is connected to the inner ends of the leads. A package body is molded (e.g.) around the die and inner portions of the leads. Outer portions of the leads extend out of the package body.

Leadframe-based packages, such as TAB packages, are similar in some respects to molded and PCB packages. For background purposes, TAB packages are typified by a relatively flexible leadframe with a tape (e.g., Kapton) backing to maintain alignment of the conductive leads. A die-receiving area is defined by the inner ends of the leads. A die is mounted to the die-receiving area, and an encapsulant (typically plastic or epoxy) is formed around the die and its connections, leaving the remainder of the leadframe exposed. These packages are relatively inexpensive, and are relatively non-hermetic.

Ceramic packages offer excellent moisture resistance, but tend to be relatively expensive. For background purposes, ceramic packages are typified by a layered assembly of ceramic and conductive traces, the traces extending to an opening in the package body. A die is mounted in the opening, and is connected to inner ends of the traces. A lid (e.g., a metal lid) is typically applied over the opening, thereby sealing the die in a package body of ceramic and metal. The conductive traces extend to external leads, pins or ball bumps on the package.

Heat is generated as a by product of operation of a semiconductor device when operating in an electronic system, and may become destructive of the device if left unabated. The problem of heat generation and dissipation is especially relevant in semiconductor devices that have a high lead count (e.g., high I/O) or which operate at high speeds, both of which factors contribute significantly to the generation of heat by the device. It is generally well known to provide some sort of heat sink for semiconductor devices. Heat sinks generally include a thermal mass having at least a heat-transferring portion positioned in close proximity to the semiconductor device (die) for efficiently extracting heat therefrom, and a heat-dissipating portion remote from the die with a large surface area for dissipating heat. The heat-dissipating portion is typically formed with a number of parallel fin layers, through which air passes to remove heat from the heat sink.

In many semiconductor device packages, notably ceramic packages, M-QUAD packages, and other "lidded" packages, the semiconductor die (device) is disposed in a cavity of the package. (Such packages are referred to hereinafter as "cavity-type" semiconductor device packages). Heat dissipation is usually accomplished in such packages through conduction of heat via a die mounting surface of the package, such as the bottom of the cavity. A significant portion of the surface area of the die, however, is not in direct contact with the die mounting surface of the package. Therefore, no significant amount of heat is removed from the die via these "unmounted" surfaces. While some attempts have been made to conduct heat from more than one surface of a semiconductor die, these approaches are often expensive or impractical due to mechanical and/or manufacturing difficulties such as thermally induced distortions of the die and/or heat sink, differential coefficients of expansion between the die and the heat conducting material to which it is connected, damage to delicate bond wires, critical tolerances, physical size and configuration of the heat conducting device, etc.

Approaches to "heat-sinking" which involve either direct contact or an adhesive bond between a heat-generating semiconductor die and a heat-sink structure (e.g., a metal heat-dissipating structure bonded to the die) can be particularly troublesome. The semiconductor die generally expands (thermally) at a different rate than the heat sink structure. At elevated temperatures (or at temperatures significantly different from the temperature at which the heat sink was bonded to the die), such differential rates of expansion can cause mechanical stresses which can result in the die (which is relatively brittle) cracking, resulting in complete device failure.

At least one rationale for metal (or solid) heat sinks in direct or close thermal contact with the semiconductor die involves the observation that removal of heat from the die by the heat sink limits the absolute temperature rise of the die, thereby simultaneously limiting the degree of differential thermal expansion between the die and the heat sink. Unfortunately, however, in order to take advantage of this characteristic, it is necessary to limit the range of ambient temperatures over which the die can operate. Such differential rates of thermal expansion can also have an adverse impact on the range of storage temperatures which a semiconductor device package can endure.

As semiconductor device speeds and I/O (Input/Output) densities increase, the issue of heat dissipation from semiconductor devices becomes considerably more critical.

As mentioned hereinabove, ceramic packages typically comprise many layers of ceramic material, and a die is disposed within a cavity in the package, and the cavity is sealed with a lid.

The present invention is applicable to other package types, including tape-based packages, resinous packages, or molded (e.g., plastic) packages. These package types are all well known. Generally, in a molded package, a die is mounted (and connected) to a leadframe and put into a mold. Plastic molding compound is transferred into the mold, forming a body about the die and an inner portion of the leadframe. Generally, in a tape-based package, a die is mounted to a tape substrate which includes one or more layers of plastic film and a layer having conductive traces. Epoxy, or other suitable material, is globbed over the die and inner portions of the substrate, forming a body about the die. In these two examples (tape, molded), it is evident that the die is essentially "buried" in the package body. These package bodies tend to be poor conductors of heat. Hence, the situation tends to be rather disadvantageous with respect to dissipating heat from the die.

OBJECTS OF THE INVENTION

It is therefore an object of the present invention to provide an electronic system utilizing at least one semiconductor device having an improved technique for dissipating heat from a semiconductor die in a cavity-type semiconductor device package.

It is another object of the invention to provide an improved technique for conducting heat from more than one surface of a semiconductor die in a cavity-type semiconductor device package used in an electronic system.

It is another object of the invention to accomplish the foregoing objects while minimizing the potential for damage to the die or its electrical connections.

SUMMARY OF THE INVENTION

The above and other objects of the present invention are satisfied, at least in part, by providing an electronic system that uses a technique that effectively removes heat generated by semiconductor devices of the system.

According to the invention, an electronic system has at least one semiconductor device (integrated circuit), wherein the semiconductor device comprises a semiconductor die disposed in a cavity-type semiconductor device package, electrical connections are formed between conductive leads of the package and the die, exposed portions of the conductive leads and the electrical connections may be covered with an inorganic dielectric coating. Examples of such coatings are gel, resin, silicon dioxide and the like. In this manner, the die is sealed, preferably hermetically, and is physically isolated from the environment of the cavity. Examples of such die-sealing techniques can be found in U.S. patent application Ser. No. 07/985,984, filed Dec. 4, 1992 by Rostoker, and incorporated by reference herein. A semiconductor die treated in this manner is referred to herein as a "coated die". Preferably the die that is "coated" with a water-impermeable material. The coating may be applied to the die prior to or after bonding. In either case, the coating can be considered to be a "primary" means of hermetically encapsulating the die.

The coating material may be a dielectric material, or an electrically-insulating material exhibiting sufficient electrical insulating characteristics that it will not short out circuit elements formed on the die or bonding means connecting to the die.

The coating material is deemed to include truly hydrophobic materials, such as Teflon (TM) or similar fluorinated polymeric material. The coating material is deemed to include dielectric materials such as $SiO_x$ or $SiO_xN_y$.

The cavity (which contains the die) is filled with a thermally conductive fluid and is sealed with a lid. A sufficient amount of the thermally conductive fluid is used that once sealed, a substantial portion of the die (or coated die) remains covered by the fluid irrespective of the preferred operating orientation of the package. A heat-pipe assembly is mounted such that a heat collection surface of the heat-pipe assembly extends into the cavity and is in contact with (immersed in) the thermally conductive fluid, preferably in close proximity to the die. Heat dissipating surfaces of the heat pipe assembly extend outward from the cavity, away from the semiconductor device package. The cavity may or may not be sealed. Generally, the heat pipe unit is sealed. A hermetic package is not necessary when using a pre-fabricated, sealed heat pipe unit.

In operation, heat from the die is transferred, via the thermally conductive fluid, to the heat-collection surface of the heat pipe. The thermally conductive fluid, which surrounds the exposed portions of the die (it should be noted that the fluid may only be near, or closely adjacent to the die if a pre-fabricated heat pipe unit is employed), permits dissipation of heat from a portion of the surface area of the die. This portion of the surface area may be large or small, an important factor being that the portion is preferably that area of the die generating a significant amount of heat which is desired to be dissipated.

The heat pipe, being primarily hollow, has a reservoir of an evaporative cooling fluid disposed within, and in contact with the other side of the heat collection surface. Heat transferred to the heat collection surface causes the cooling fluid to evaporate or "boil." As vapor, the cooling fluid travels convectively within the heat pipe until it comes in contact with cooler interior surfaces of the heat pipe assembly. These cooler interior surfaces are in thermal communication with and are cooled by the heat dissipating surfaces of the heat pipe. Upon contacting the cooler surfaces, the cooling fluid vapor condenses back into fluid, releasing a substantial amount of heat in the process. The now cooled condensate flows back in liquid form into the reservoir, where the evaporation-condensation cycle begins anew.

According to one aspect of the invention, the heat-collection surface of the heat pipe is introduced into the cavity by means of an opening in the lid designed to fit the heat pipe. The heat pipe is sealed and adhered to the lid by means of a suitable sealant, or by any other suitable technique. As necessary, other mechanical support for the heat pipe can be provided. Either the heat pipe or the opening in the lid can be provided with a groove or notch to permit escape of the thermally conductive liquid during assembly and to help ensure that the cavity is as full as desirable with thermally conductive liquid.

According to another aspect of the invention, the lid may be provided with one or more holes. The holes can be used to completely fill the cavity after covering it with the lid and to permit excess fluid to escape when the heat pipe is inserted. When the cavity is completely filled and the heat pipe is in place, the holes are sealed with a suitable plug or sealant.

The use of the (generally inorganic, and traditionally dielectric) coating around the die and conductive leads serves to protect the die from any adverse effects of direct contact with the conductive fluid (again, a pre-fabricated heat pipe unit would typically not allow such direct contact, but would sit over or on the die with a plate, adhesive, thermal grease or the like), and permits selection of the thermally conductive fluid from a much wider range of choices than would be available without the coating. Since the die, connections and conductive leads are protected, liquids can be used which are highly thermally conductive, but which would otherwise attack metal on the die or the metal of the connections or conductive leads.

The thermally conductive liquid may be any suitable liquid such as fluorocarbon, alcohol, water, ethylene glycol, ether, helium or hydrogen. (Silicon oil and silicate gel are also contemplated as being suitable thermally conductive liquids). The cavity can be filled with the liquid before sealing the cavity with a lid, or alternatively, the lid can be provided with one or more filling holes through which the liquid can be introduced into the cavity. Alternatively, a prefabricated heat pipe unit would be pre-packaged (pre-filled) with the thermally conductive (preferably evaporative) fluid. In the event that filling holes are provided in the lid, they are sealed after introduction of the liquid into the cavity.

According to another aspect of the invention, a relatively inert (e.g., non-conductive and non-reactive) thermally conductive fluid, (e.g., silicone, or other oil) can be used without an inorganic, dielectric or other protective coating over the die.

According to another embodiment of the invention, an absorptive wick can be employed to gather condensate (condensed evaporative coolant) and to transport it back to the heat source, thereby reducing or eliminating the dependency of the semiconductor device assembly upon its orientation relative to gravity. The wick is thermally attached to the semiconductor die (it may simply be laying upon a surface of the die), either directly or indirectly (e.g., via the thermally conductive fluid or via another thermally conductive member), and extends into portions of the semiconductor device assembly wherein coolant condensation occurs and/or into a reservoir of evaporative coolant. Capillary action causes the coolant to be absorbed into the wick (like a sponge) and transported to the vicinity of the die. Heat from the die causes the coolant to evaporate. As coolant is evaporated from the wick, capillary action causes more coolant to replace it. Evidently, the use of a wick requires that the die-facing end of the heat pipe is open (i.e., not sealed), thereby allowing the wick to extend out of the heat pipe.

According to another aspect of the invention, the absorptive wick technique can be applied with or without the intermediate thermally conductive fluid. In assemblies where a thermally conductive fluid is not used, the heat pipe opens directly into the die cavity of the package (e.g., into the space between the opposing lids of an M-Quad package).

According to another aspect of the invention, hollow fins can be employed to increase the surface area on which coolant condensation can occur.

According to another aspect of the invention, the wick material can be extended into the hollow fins.

The present invention is not limited to dissipating heat from a cavity-type package. It is also contemplated that a heat pipe could be pre-fabricated as a unit, positioned over a die (in a manner similar to conventional heat sink masses and plugs). Such a pre-fabricated unit could be used in connection with a tape based package, and could also be used beneficially with resin packages or transfer-molded packages. For example, a molded package could be molded with a hole extending from an outer surface thereof towards (completely to) the die, and a heat pipe (fluid tower) could have its end inserted into the hole in the molded package (and sealed and adhered thereto with a suitable adhesive). In a similar manner, a hole extending to the die can be provided in an epoxy (or the like) body encapsulating a die, and a heat pipe could be inserted into the hole. In this manner, packages which are otherwise quite unsuitable for dissipating heat can be modified to have excellent thermal dissipation characteristics.

By coating the semiconductor die(s) and/or additional electronic component(s) with a water-impermeable coating, they are co-isolated from the outside environment, effectively providing the equivalent of a hermetic seal, at relatively low cost. The coating is very thin and may not provide adequate protection against physical damage (e.g., to delicate bond wires), in which case a protective covering or package body can also be provided. Because the "hermeticity" of the electronic devices (dies, passive components, etc.) is already ensured by the relatively water-impermeable coating, less expensive and relatively water-permeable packaging techniques may be used to provide physical protection, while still providing moisture protection equivalent to that of hermetically sealed ceramic or metal packages.

It is contemplated that the present invention may utilize system level products comprising single chip modules (SCM) often including other electrical components (such as capacitors, resistors, inductors, etc.); multi-chip modules (MCM) having at least two integrated circuit dice in the same or separate ceramic, resin, or substrate board packages, with or without other electrical components; board level products (BLP) such as those having multiple integrated circuits on printed wiring board(s) (PWB); and box level products (Boxes) which may include a combination of elements from the list of SCM, MCM, BLP and the like. One or more of such SCM, MCM, PWB or BLP's may act as, or be integrated into a functional system or subsystem. The system level products contemplated include digital (or other) data storage systems; security and surveillance systems, general purpose computers (such as personal computers, work stations, servers, mini computers, mainframe computers and super computers); digital audio and video compression and transmission systems; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications systems (such as PBX, telephone switching, voice mail, auto attendant, network controllers, video teleconferencing, digital data transmission (such as token ring, ethernet, ATM, or the like), and including subsystems or subassemblies for inclusion or attachment to more complex system level products.

Other and further objects, features and advantages will be apparent from the following description of a presently preferred embodiment of the invention, given for the purpose of disclosure and taken in conjunction with the accompanying drawings.

DETAILED DESCRIPTION OF THE PREFERRED EMBODIMENTS

The present invention is an electronic system utilizing at least one semiconductor device having a semiconductor die disposed in a cavity-type semiconductor device package. Electrical connections are formed between conductive leads of the package and the die. Exposed portions of the conductive leads and the electrical connections are covered with an inorganic dielectric coating, such as silicon dioxide, thereby "hermetically" sealing the die from its surroundings in the cavity. The cavity (which contains the die) is filled with a thermally conductive fluid and is sealed with a lid. A heat-pipe assembly is mounted such that a heat-collecting surface of the heat pipe assembly is immersed in the fluid, preferably in close proximity to the die. Once the heat pipe assembly is in place, the cavity is sealed, thereby enclosing the die, its connections, the thermally conductive fluid, and the heat collecting surface of the heat pipe. The remainder of the heat pipe extends out of the sealed cavity, permitting it to carry heat away from the semiconductor die, and ultimately away from the electronic system.

The following descriptions of the inventive technique of the system are directed to dies which are electrically connected via bond wires, but it will be readily understood by one of ordinary skill in the art that any electrical die connection technique can be readily accommodated by the present inventive technique, and that an encapsulating coating of an inorganic dielectric material (e.g., $SiO_2$) may be applied over any semiconductor die and its electrical connections by the techniques described hereinabove.

Figure 1A:
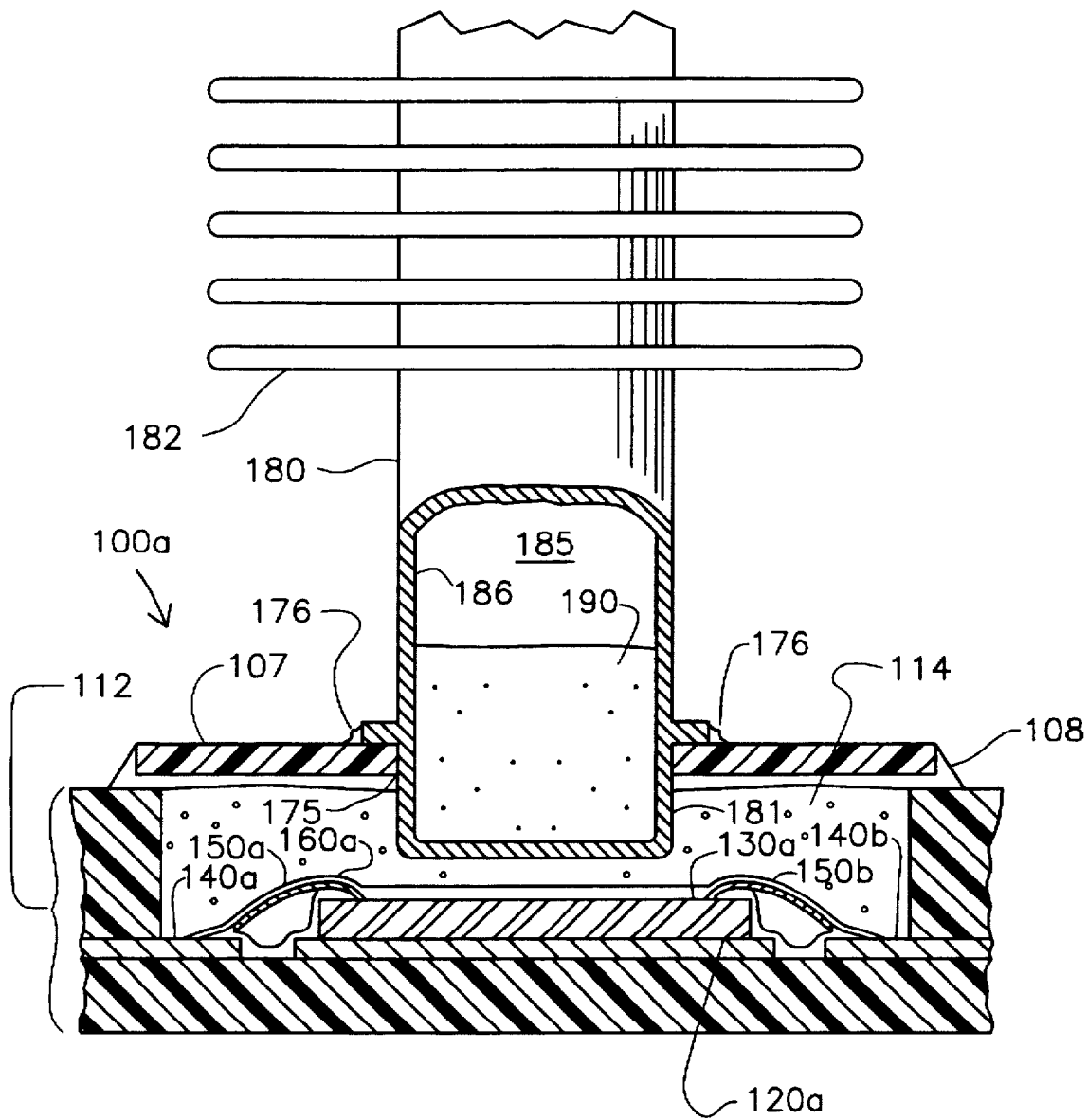
FIG. 1a is a cross-sectional view of a fluid-filled, heat pipe cooled semiconductor device assembly incorporating an over coated semiconductor die.

FIG. 1a is a cross-sectional view of such an arrangement. A semiconductor device assembly 100a includes a cavity-type semiconductor device package 12. A semiconductor die 130a is mounted to die attach pad 120a in the cavity, and connections are formed between the die 130a and conductive traces 140a and 140b in the package by bond wires 150a and 150b. The die 130a, the bond wires 150a and 150b and the exposed portions of the conductive traces are then coated with an inorganic, dielectric material, (e.g., silicon dioxide). (Other exposed surfaces may also be coated, e.g., the bottom surface of the cavity, the die attach pad, etc.). The package body 112 may be formed of any suitable packaging material such as plastic, ceramic, or a multi-layer printed circuit board material where an opening is formed in some of the layers to form the recess.

Next, the cavity is filled with a thermally conductive fluid 114 (e.g., fluorocarbon, silicone oil, helium, hydrogen, silicate "gel", etc.). A lid 107 has an opening 175 through which a heat gathering surface 181 of a heat pipe is inserted. The heat pipe is mounted attached to the lid and sealed by any suitable technique, e.g., an adhesive sealant, brazing, welding, etc., covers the cavity and seals it (by means of a suitable sealing technique, e.g., adhesive sealant 108).

The heat pipe has a hollow interior 185, and is filled with an amount of evaporative coolant 190 and oriented such that a reservoir of evaporative coolant 190 is in contact with the interior walls 186 of the heat pipe in the area of the heat collection surface 181. A hollow shaft 180 of the heat pipe leads to heat dissipating fins 182.

In operation, heat generated in the die 130a is carried away from the die by conduction through the thermally conductive liquid 114 to the heat collecting surface 181 of the heat pipe, thereby heating the evaporative coolant 190. Upon heating, the evaporative coolant 190 evaporates or "boils" to a vapor phase. As a vapor, the coolant 190 travels convectively through the shaft 180 of the heat pipe to the area where the fins 182 are mounted. The relatively cooler interior walls 186 of the heat pipe in the vicinity of the fins 182 causes the coolant 190 to condense, releasing a substantial amount of heat in the process. The condensed coolant, now liquid, flows back down into the reservoir, where the evaporation-condensation cycle begins again.

It will be readily appreciated by one of ordinary skill in the art that: there are many different possible physical heat pipe configurations which may be employed in this manner and that the vertical heat pipe configuration shown in FIG. 1a is merely exemplary of these.

The use of the inorganic dielectric coating around the die and conductive leads serves to protect the die from any adverse effects of direct contact with the conductive fluid, and permits selection of the thermally conductive fluid from a much wider range of choices than would be available without the coating. Since the die, connections and conductive leads are protected, liquids can be used which are highly thermally conductive, but which would otherwise attack metal on the die or the metal of the connections or conductive leads.

U.K. Patent number GB 2105729, describes a pulsed plasma process for depositing inorganic coatings suitable for use in the various embodiments of the present invention. This process is based on the concept that if full dissociation of precursor gases is achieved in the gaseous phase, then deposition of high-quality layers of inorganic films at room temperature is possible. At pulsed power densities (RF or microwave) of 100 to 300 W/cm3, deposition rates in excess of 0.3 µm/min. of high-quality, low-stress inorganic films are possible, even without substrate bias. Pulse repetition rates and gas exchange rates are matched and adjusted to give a low average power and full reactant replenishment (complete exchange of gases) with each pulse. Since the reactants may be changed for each pulse, the process lends itself to multi-layer coatings with minimal loss in deposition rate.

Another process for depositing inorganic coatings suitable for use in the various embodiments of the present invention is microwave ECR (Electron Cyclotron Resonance) deposition. The microwave ECR process is a "downstream" process, i.e., a plasma containing the reactants is created in a separate chamber which is joined by a tube to a coating chamber containing the article to be coated. The reactive species are then transported by gas flow to the coating chamber where they are exposed to a cross flow of silane to produce the coating. The reactants are created in the plasma chamber, but survive at least long enough to react in the coating chamber. Plasma environments tend to be rather "chaotic" high-energy environments, and can have serious destructive effects on finished semiconductor devices. Because of the downstream nature of this process, which keeps the article to be coated (presumably a semiconductor device) away from the direct effects of the plasma environment, the damage to the article (e.g., to the die) is minimal. Other methods of depositing an inorganic, dielectric coating are also considered.

Figure 1B:
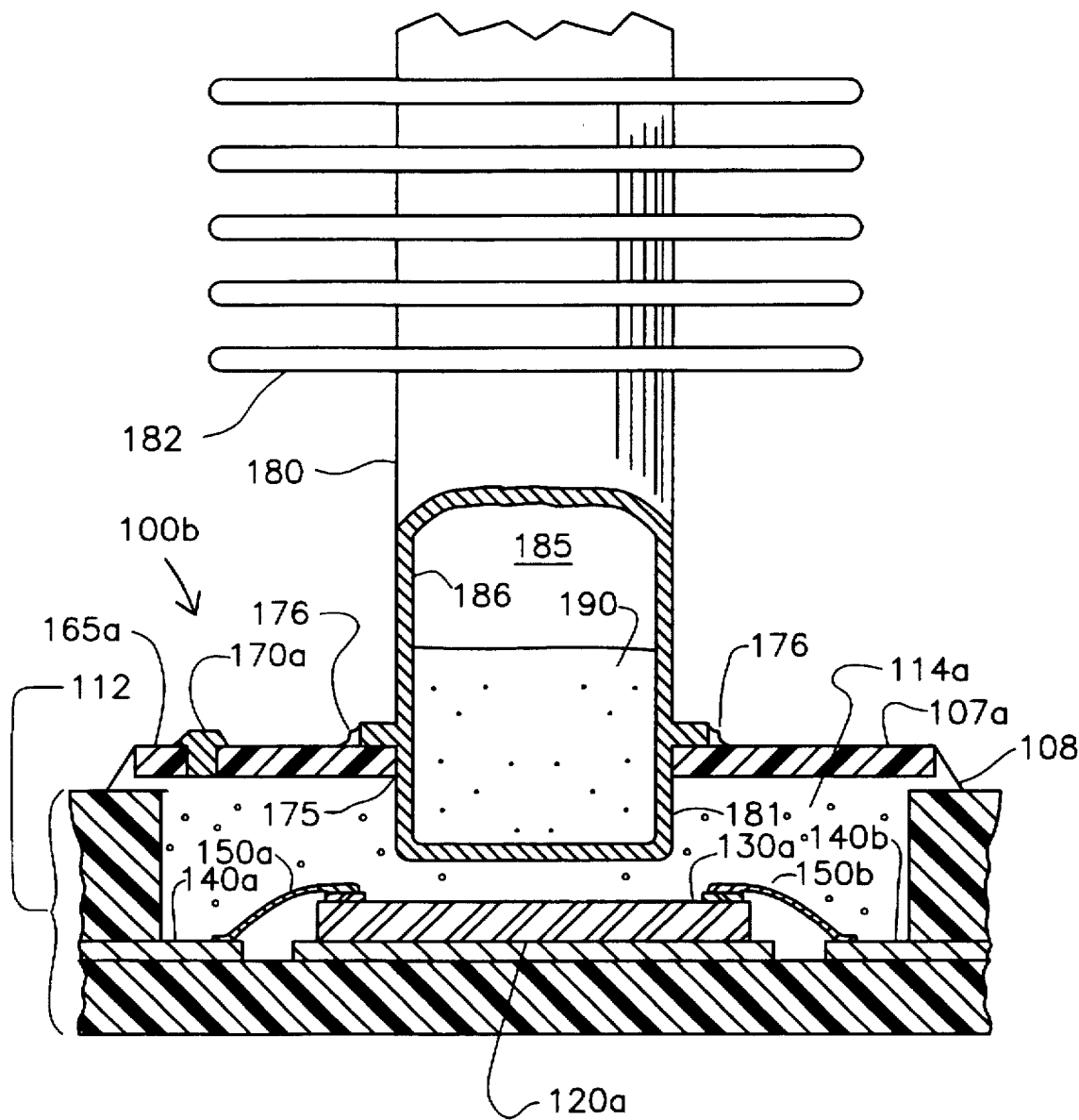
FIG. 1b is a cross-sectional view of another embodiment of a fluid-filled, heat-pipe cooled semiconductor device assembly, according to the invention.

FIG. 1b shows another embodiment of a semiconductor device assembly 100b, identical to FIG. 1a in all respects except that a lid 107a with a "vent" hole 165a is used to cover the cavity, and no inorganic, dielectric coating is used. The lack of an inorganic, dielectric coating restricts the choice of thermally conductive fluid to one which is relatively "inert" (i.e., nonconductive and non-reactive with the materials in the cavity, e.g., silicone oil). The "vent" can be used to facilitate assembly of the package 100b. Assuming that the cavity is filled with the thermally conductive fluid 114 prior to covering it with the lid 107a, the "vent" hole permits fluid, displaced by the heat pipe, to escape during assembly. After assembly, the hole 165a can be sealed with a suitable plug or sealant glob 170a. Another approach is to fill the cavity via the vent hole 165a. Alternatively, two holes can be used, the first hole being used to fill the cavity with the thermally conductive fluid, and the second hole being used as an escape vent for gas in the cavity. Fluid emanating from the second hole (i.e., the one not being used to fill the cavity) indicates that the cavity is full. Using this technique, it is possible to completely fill the cavity. After the cavity is full, both holes are sealed with suitable plugs or sealant globs.

Another approach to assembly of the semiconductor device assemblies shown in FIGS. 1a and 1b is to assemble the heat pipe to the package through the lid after the package has been filled with the thermally conductive fluid. In order to assemble the heat pipe to the package, it is necessary to provide a way to allow thermally conductive fluid displaced by the heat pipe to escape. In order to accomplish this, a notch can be provided in the opening which receives the heat pipe assembly. This is shown in FIG. 2a.

Figure 2A:
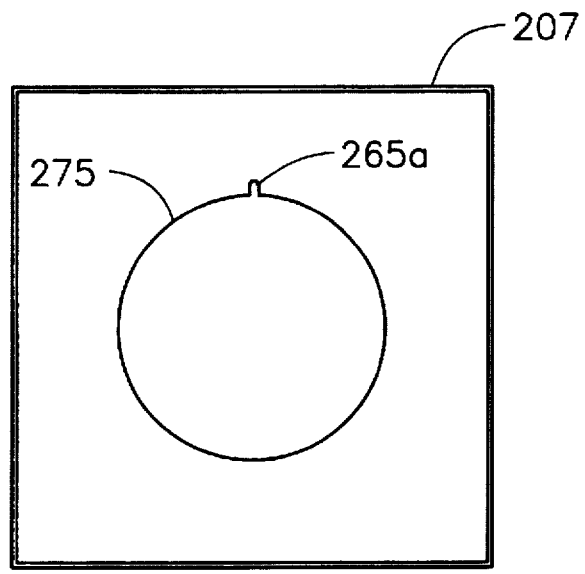
FIG. 2a is a view of a notched semiconductor device assembly lid, according to the invention.

FIG. 2a is a top view of a lid 207 for a cavity-type semiconductor device. An opening 275 is sized to fit a heat collecting portion of a heat pipe. A notch 265a in the opening 275, permits excess fluid to escape during assembly. When the heat pipe opening is sealed, the sealant seals the notch as well.

Figure 2B:
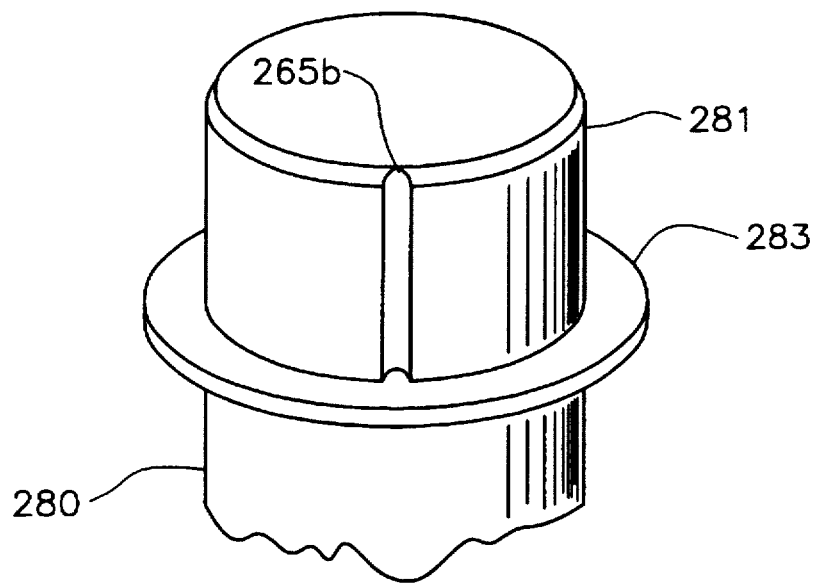
FIG. 2b is a view of a portion of a heat-pipe assembly, illustrating a notched surface, according to the invention.

Another approach is to groove the end of the heat pipe assembly which is inserted through the opening. In similar fashion, this permits excess fluid to escape during assembly. FIG. 2b is a view of such a heat pipe assembly. The heat pipe assembly has a shaft 280, a mounting flange 283, and a heat collecting surface 281. A groove 265b in the heat collecting surface permits the fluid to escape. As with the notched opening, when the heat pipe is sealed to the package, the groove is sealed as well.

While a number of specific embodiments are shown, these are merely exemplary of the many possible fluid-filled, heat-pipe cooled packages which can be fabricated using this technique. It will be readily understood by one of ordinary skill in the art that other cavity-type packages, such as the "M-Quad" package (which is characterized by a plastic sealing and bonding ring between a pair of opposing lids, at least one of which has a "vent" hole to facilitate assembly) may be readily accommodated by the present inventive technique.

It will readily appreciated by one of ordinary skill in the art that the orientation (relative to gravity) of the heat pipe assemblies described hereinabove is crucial to the evaporation/condensation cooling cycle of the heat pipe. This is because the condensate (condensed coolant) relies at least in part on gravity to cause it to flow back to form a reservoir in the vicinity of the heat source (die). Since the die is ultimately cooled by the condensate, any inefficiency or ineffectiveness in returning the coolant (condensate) to the die after condensation results in reduced efficiency or effectiveness in heat transfer from the die.

In an embodiment of the invention, shown in FIGS. 3a–d, an absorptive wick is employed to facilitate return of condensate to the vicinity of the die and to reduce the sensitivity of cooling efficiency to orientation of the package. By disposing an absorptive wick material within a heat pipe cavity, the wick material will "gather" condensate as it condenses, much like a sponge. If the wick is thermally connected to a heat source (e.g., the semiconductor die) either by direct attachment or by indirect attachment via another heat conducting member, capillary action will transport the condensate (coolant) to the point of attachment, where it will evaporate when exposed to heat from the heat source (e.g., die). As coolant evaporates from the wick, more coolant is brought by capillary action through the wick to replace it. In such a "wicked" assembly, capillary action can substantially replace gravity as the primary means for effecting return of the coolant to the heat source (i.e., to the die generating heat). The wick will also tend to "wick" liquid coolant up the sides of the heat pipe, for more efficient cooling of the liquid.

According to a feature of the invention, the wick can be extended into a variety of locations within the package assembly to more readily transport condensate from a variety of different places. This feature can be used to great advantage to reduce the dependency of the evaporation/condensation cooling cycle on the orientation of the assembly. By extending the wick into all locations where the condensate can "pool", the heat-pipe cooled semiconductor device assembly can be made relatively orientation independent.

The M-Quad package is particularly suitable for adaptation to such "wicked" heat pipe cooling, as described herein, since the M-Quad package consists essentially of a semiconductor die, leadframe, and substrate sandwiched between a pair of hollow metal or plastic lids. Either or both of the hollow lids can be adapted to accommodate a wick and evaporative coolant, thereby providing a substantial increase in heat dissipation in relatively low-cost packages such as the M-Quad package. Semiconductor device assemblies of this type, wherein the lid assemblies are modified to create heat-pipe structures, are described in greater detail hereinbelow with respect to FIGS. 3a–3d.

Figure 3A:
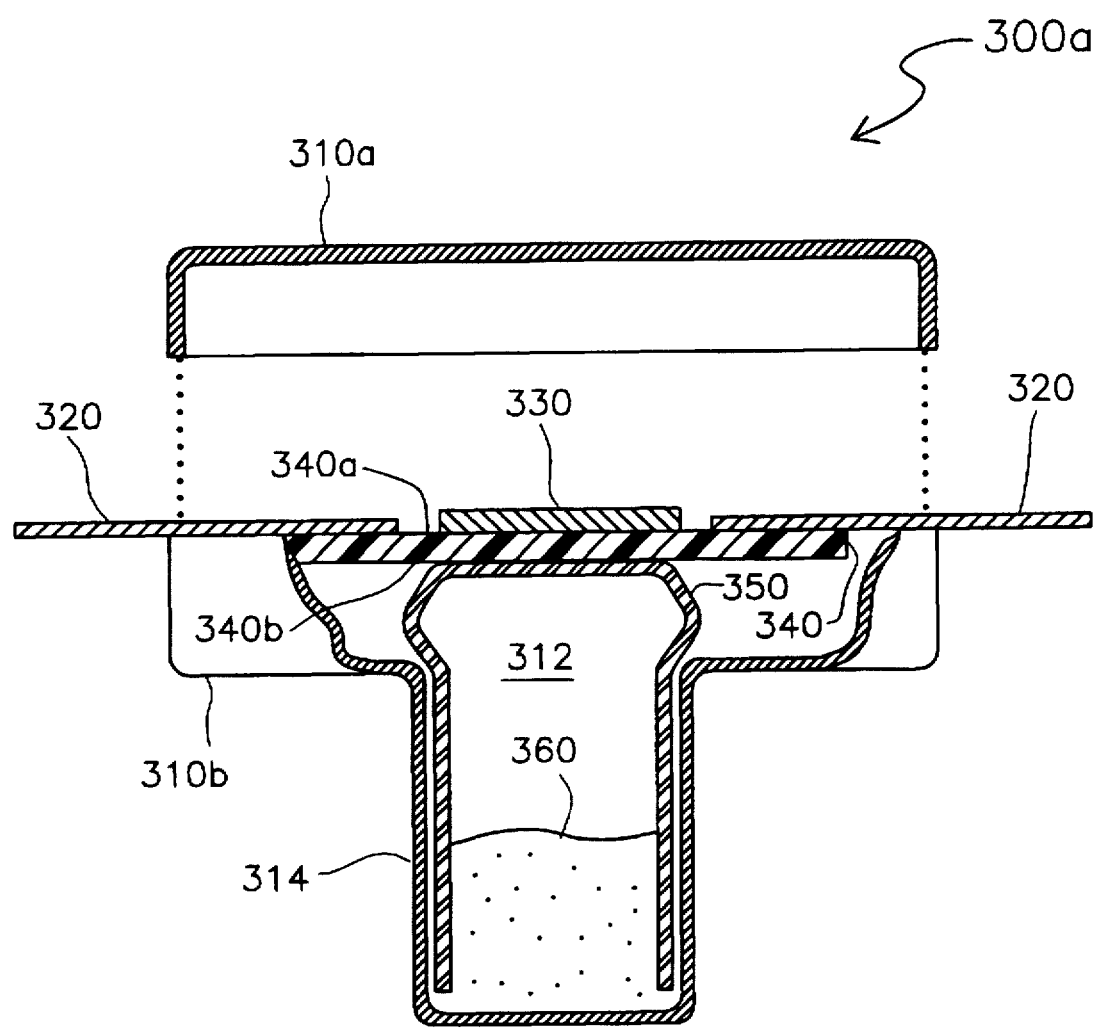
FIG. 3a is a view of a heat-pipe cooled semiconductor device assembly employing an absorptive wick, according to the invention.

FIG. 3a is a cross-sectional (partially exploded) view of a heat-pipe cooled semiconductor device assembly 300a employing an absorptive wick 350. The semiconductor device assembly 300a comprises a pair of hollow lid members 310a and 310b oriented to face each other and form a cavity for a die therebetween, a semiconductor die 330 disposed on the top surface 340a of a substrate within the cavity formed by the lids, a leadframe (pattern of conductive traces disposed on the top surface 340a of the substrate) 320, a quantity of evaporative coolant 360 disposed within a heat pipe 314 having an end open to the cavity through one of the lid members, and an absorptive wick 350 disposed within the heat pipe 314 and extending into the cavity into close proximity with the die. In FIG. 3a, the die is shown mounted to the top side 340a of the substrate 340, and the leads 320 are also shown disposed on the top surface of the substrate. The substrate 340 serves to provide a degree of mechanical stability between the die 330 and the leadframe 320, and may be formed of a plastic film material. The assembly of the leadframe 320, die 330 and substrate 340 is sandwiched between the two hollow lids 310a and 310b. The lower lid 310b has a heat pipe protrusion 314 extending therefrom. When oriented as shown in the figure, the evaporative coolant 360 will pool at the closed end of the heat pipe 314, away from the die. The wick 350 is preferably attached (i.e., with a suitable adhesive) to the bottom surface (side) 340b of the substrate 340, immediately underneath the die 330. The substrate 340 is sufficiently thermally conductive to provide good thermal path (conduction) between the die 330 and the wick 350. The wick 350 extends downward into the interior 312 of the protruding heat pipe 314, and further into the pool of evaporative coolant 360.

In operation, capillary action causes the coolant 360 to be absorbed into the wick 350 and to be transported via the wick 350 to the vicinity of the die 330 (at the attachment point of the wick 350 to the bottom side 340b of the substrate 340). Heat generated by the die 330 causes the coolant 360 in the wick to evaporate, thereby transferring a substantial amount of heat from the die to the coolant. As the coolant 360 evaporates, it is replaced by more coolant 360 transported by capillary action through the wick 350. When the evaporated coolant (in gaseous form) comes into contact with cooler exterior surfaces of the bottom lid 310a and heat pipe protrusion 314, the coolant condenses back into liquid form and flows back into the pool of coolant 360 in the protrusion 314, where it is once again able to be transported by the wick to the back side of the substrate immediately opposite the die. In order to facilitate free flow of gaseous state coolant to the cooling surfaces of the assembly 300a without said gases being impeded by the wick 350, the wick should be formed with an open (e.g., loosely weaved, or open mesh) construction or the like. A substantially solid wick could also be perforated to allow the gaseous state coolant to condense on the interior surfaces of the heat pipe.

It will be recognized by one of ordinary skill in the art that the "conventional" dependency in heat pipes (e.g., those described hereinabove with respect to FIGS. 1a and 1b) upon gravity to return condensed coolant back to the heat source is reversed in the embodiment of FIG. 3a. In the semiconductor device assembly 300a, gravity is used to cause (i.e., causes) the coolant 360 to pool in a location distant from the heat source (i.e., at the bottom of the heat pipe 314). This would seem inapposite to the idea that coolant should pool as close to the heat source (i.e., to the die) as possible. However, according to this embodiment of the invention, capillary action through the mechanism of the wick 350 causes the coolant 360 to be passively transported to the heat source (die 330). It will further be appreciated by one of ordinary skill in the art that the top lid 310a can be similarly modified (either in addition to or instead of the bottom lid 310b) with the wick being used to collect condensate as it forms and to return it to the die 330.

One of ordinary skill in the art will readily appreciate that cooling fins can be disposed around the heat pipe protrusion and/or package lids to facilitate heat removal from the package and condensation of the evaporated coolant. For example, fins similar to those shown as 182 in FIG. 1a can be formed about the heat pipe protrusion 314 in FIG. 3a. It is also possible to form cooling fins directly on the surface(s) of the lids of the semiconductor device assembly (described hereinbelow with respect to FIG. 3d) to similarly facilitate heat removal. A flow of cooling gas can be further directed across the cooling fins to further facilitate cooling of the assembly.

According to another aspect of the invention, the heat pipe protrusion (e.g., 314) can be outfitted with hollow cooling fins. The interior surfaces of the hollow fins greatly expand the amount of cooling surface area to which gaseous (evaporated) coolant is exposed, greatly improving heat transfer. The wick material can be extended into the hollow fins to gather coolant as it condenses. If the orientation of the semiconductor device assembly is known and the fins can be positioned above the die (with respect to gravity), it is not necessary to extend the wick into all of the hollow fins, since gravity will cause the condensate (coolant) to flow naturally from the fins. Further, the fins can be formed at a slight upward angle relative to the body of the heat pipe protrusion to further facilitate drainage of condensate from the fins into the heat pipe. Assemblies of this type are shown and described with respect to FIGS. 3b and 3c. In order to reduce illustrative clutter, coolant (360), which was explicitly shown in FIG. 3a is omitted from the views of FIGS. 3b–3d.

Figure 3B:
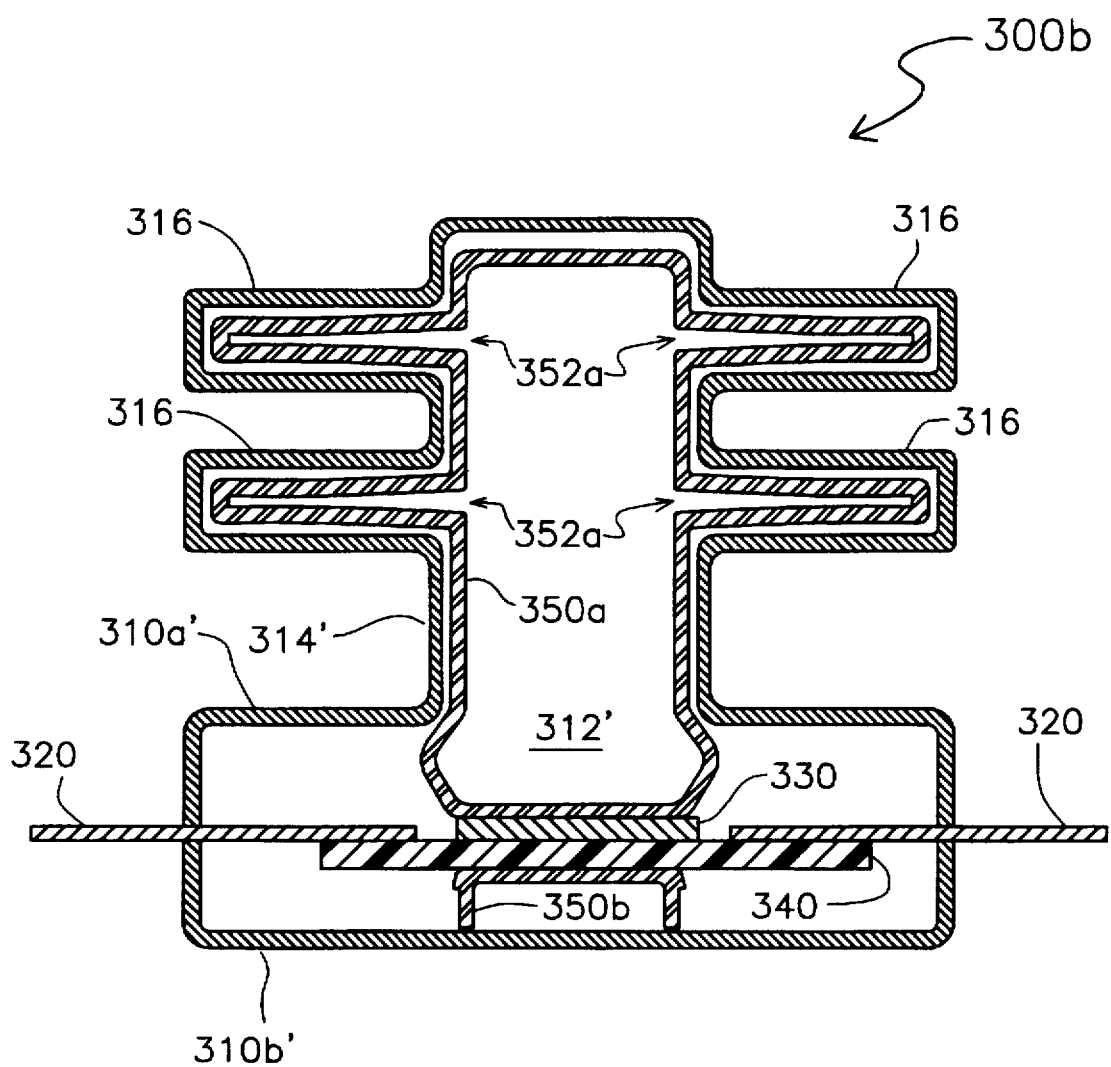
FIG. 3b is a cross-sectional view of a heat-pipe cooled semiconductor device assembly employing an absorptive wick and hollow, "wicked" cooling fins, according to the invention.

FIG. 3b is a cross-sectional view of a wicked heat pipe cooled semiconductor device assembly 300b employing hollow fins, according to the invention. Similar to the embodiment shown in FIG. 3a, the assembly 300b includes substrate 340, die 330, coolant (not shown), and leadframe 320. An upper lid 310a' has a heat pipe protrusion 314' extending therefrom with hollow fins 316 extending radially from the protrusion 314'. An absorptive wick 350a is disposed onto a face of the die (and may be attached with a suitable adhesive thereto) and extends into the interior area 312' of the heat pipe protrusion 314', as well as into the interior portions 352a of the hollow fins 316.

A lower lid 310b' of the assembly 300b has no heat pipe protrusion. However, a second wick 350b may be employed as follows. The second wick 350b is attached to the bottom side of the substrate 340 directly under the die 330, in much the same manner as the wick 350 shown in FIG. 3a, and extends to the bottom inner surface of the bottom (lower) lid 310b'. In this manner, the second wick 350 gathers any condensate which may pool in the lower lid 310b' and, by capillary action, returns the coolant to the back side of the die for further cooling action to occur. Generally, if there is not a "barrier" preventing liquid from pooling in the lower lid element, such a bottom wick (350b) will be relatively important.

Figure 3C:
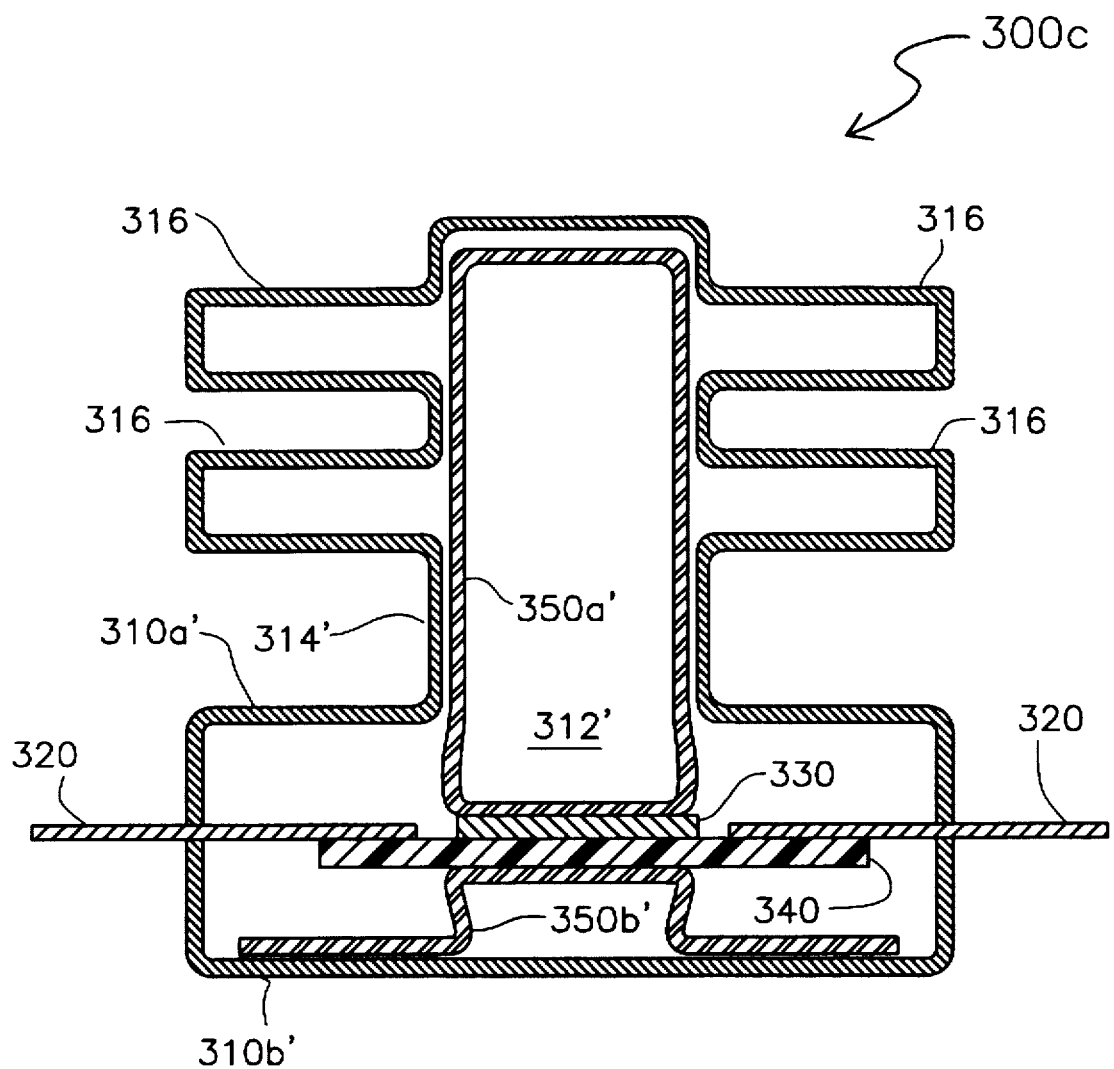
FIG. 3c is a cross-sectional view of a heat-pipe cooled semiconductor device assembly, similar to that of FIG. 3b, but employing "un-wicked" cooling fins, according to the invention.

FIG. 3c shows an assembly 300c similar to that of FIG. 3b, but designed for use where the orientation is known to be vertical (as depicted). In this case, a different wick 350a' is used. The wick 350a' extends into the interior portion 312' of the protrusion 314', but does not extend into the hollow fins 316. In the known orientation, gravity will naturally cause the condensate to flow from the hollow fins back into the interior portion 312' of the protrusion 314', where it will be collected by the wick.

In the embodiment of FIG. 3c, a second wick 350b' is shown. The second wick 350b' is extended to cover more of the interior surface of the lower lid 310b' than was shown with respect to the second wick 350b of FIG. 3b, thereby providing for more complete absorption of any condensate (pooled coolant) in the lower lid 310b'.

It will be readily appreciated by one of ordinary skill in the art that various features of the embodiments shown in FIGS. 3a, 3b and 3c can be combined (e.g., mixed and matched). For example, it is contemplated that a semiconductor device assembly having heat pipe protrusions extending from both lids can be formed, each heat pipe protrusion optionally having hollow fins. (Of course, having heat pipe protrusions extending from both sides of the package would necessitate mounting to a circuit board or the like having an opening designed to accommodate the protrusion of one of the heat pipes.)

Where heat dissipation requirements are less stringent than contemplated by the previous embodiments of the invention, it is within the scope of this invention to create a "wicked" evaporatively cooled semiconductor device assembly without heat pipe protrusions. Such an assembly is shown in FIG. 3d.

Figure 3D:
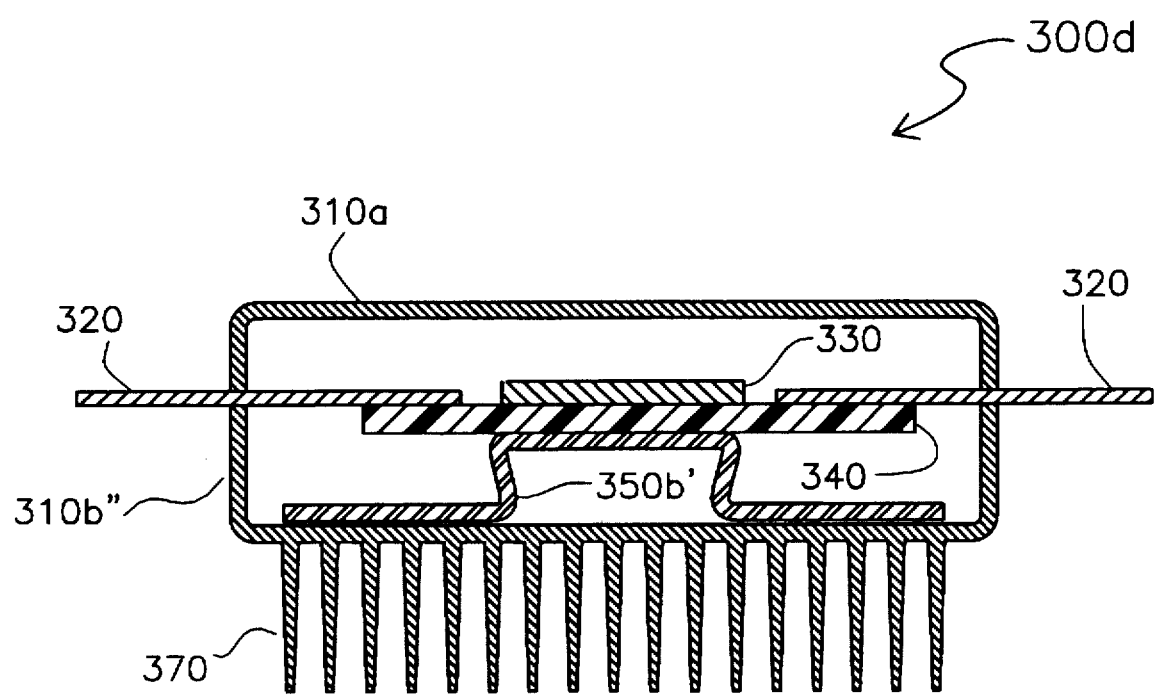
FIG. 3d is a cross-sectional view of a semiconductor device assembly employing "wicked" evaporation/condensation cooling without a heat-pipe protrusion from the body of the package, according to the invention.

FIG. 3d is a cross-sectional view of an evaporatively cooled semiconductor device assembly 300d, according to the invention, which does not include heat pipe protrusions. This assembly 300d includes the die 330, leadframe 320, coolant (not shown), and substrate 340 as employed in FIGS. 3a–c. The top lid 310a (same as in FIG. 3a) is a plain, hollow lid without protrusions. A bottom lid 300b" optionally (and preferably) has cooling fins 370 extending from the exterior surface thereof. The wick 350b' (similar to the second wick shown in FIG. 3c) extends from a point on the substrate immediately behind the die into contact with the inner surface of the lower lid 310b" to gather condensed coolant and to return it to the heat source (i.e., die). Lower heat dissipation requirements permit the assembly 300d to function without the added interior condensation area of either heat pipe protrusions or hollow cooling fins and, in some cases, external fins on the lower lid may not be necessary. For example, if the heat dissipation requirement is small enough, some or all of the cooling fins 370 could be omitted. If there is some significant heat dissipation requirement, and fins are not feasible for one reason or another, the exterior surface of the lower lid could be disposed against a thermal, heat-dissipating mass on a circuit board, such as by clamping the package to the board and providing thermal grease between the lower lid and the thermal mass. In this way the system of the invention may utilize a common heat dissipation means for all of the semiconductor devices of the system.

Evidently, the embodiment of FIG. 3d could be augmented by the provision of another wick, virtually identical to the wick 350b', but disposed within the upper part of the package so as to extend from the front of the die to the inner surface of the top lid 310a. In this manner, true orientation-insensitivity can be achieved.

It should be understood that "orientation", as discussed herein, refers to the ultimate orientation of the package (e.g., 300d) as it is mounted to a circuit board or the like. Generally, in earth-bound applications, the ultimate orientation of the package in use may be known. However, in other applications, such as in military aviation, the orientation of the package may vary widely, depending on the attitude of the system in which the packaged device in the system is employed. With respect to the wick embodiments of this invention, a main feature (advantage) is insensitivity to physical orientation, vis-à-vis gravity. An ancillary advantage is that the condensed coolant can advertently be caused to pool at a place where it will cool the best, rather than at a place where it can absorb heat the best. This is a rather non-intuitive result of employing the wick.

It is within the spirit and scope of the present invention that the techniques described hereinabove be used alone or in combination. For example, in the assemblies incorporating absorptive wicks (FIGS. 3a–d) the die itself can be "hermetically" coated with a water-impermeable coating. Cooling fins similar to those shown in FIG. 3d can be applied to package lids in any of the other embodiments. Further, the absorptive wick techniques described hereinabove with respect to FIGS. 3a–d can be employed in the heat pipes of FIGS. 1a and 1b to reduce or eliminate sensitivity of the heat pipe cooled semiconductor device assemblies to physical orientation.

UK Patent Publication Number 2,105,729 has been referred to hereinabove as a suitable technique for applying the relatively water-impermeable coating to the die. Additional techniques of applying the relatively water-impermeable coating to the die are discussed in:

(1) *Low Temperature and Atmospheric Pressure CVD Using Polysiloxane OMCTS and Ozone*, Fujino, et al., J. Electrochem. Soc. Vol. 138, No. 12, December 1991, The Electrochemical Society;

(2) *Excimer laser CVD of Silicon Oxide on GaAs: a comparison with deposition on c-Si*, Gonzalez, et al., Applied Surface Science, Vol. 54, pp. 108–111, January, 1992; and (3) *Deposition of $SiO_2$ films from ArF laser Photolysis of $SiH_4N_2$ Mixtures*, Tsuji, et al., Japanese Journal of Applied Physics, Vol. 30, Issue 11a pp. 2868–72, November, 1991.

These references are incorporated by reference herein as nonessential background material.

As mentioned hereinabove, a heat-pipe unit can also be prefabricated and employed as an add-on to an existing package, which package may be other than a cavity-type package. Generally, such embodiments would resemble the heat pipe units illustrated in FIGS. 1a and 1b, and would be pre-filled with coolant sealed therein. For example, such a pre-fabricated heat pipe could be inserted into a hole extending through a resin or plastic body encapsulating a die (such as in tape-based or molded type packages) to a position closely adjacent to (compare FIGS. 1a and 1b) or in contact with a surface of the die. The pre-fabricated heat pipe unit could be sealed within the hole to provide mechanical stability and/or protection of the die from the environment. It is further possible that a sealed, pre-fabricated heat pipe unit could be provided with a wick, such as in FIGS. 3a–3c, but that the wick would be contained entirely within the heat pipe unit. The wick would serve a similar function to the wicks described with respect to FIGS. 3a–3d. One skilled in the art to which this invention most nearly pertains will understand such alternative constructions without further description.

Irrespective of whether the package is ceramic, tape-based, molded, or other package type, it is assumed that a die is disposed within a package body, whether or not the package has a cavity. Generally, the invention related to providing a heat pipe unit from without to within the package body to remove heat from the operating die (semiconductor device). The heat pipe unit may be sealed, or may be open at one end, and may or may not be provided with a wick.

Many other combinations of features, some of which have been expressly set forth hereinabove, are within the spirit and scope of this invention and may be advantageously utilized in SCM, MCM, and BLP systems as contemplated herein.

System level products may be designed and fabricated in various forms. A system level product may, for example, include a single chip modules ("SCM") having a single semiconductor die in a single package body, with or without other electrical components, such as capacitors. System level products may also include multi-chip modules ("MCM") having two or more semiconductor dies in the same or separate package bodies, with or without other electrical components. System level products may also include board level products ("BLP"), such as those having one or more semiconductor devices on one or more printed wiring boards. Box level products ("Boxes") are also system level products which may include a combination of SCMs, MCMs, BLPs, and/or other devices. One or more of such SCMs, MCMs, BLPs or Boxes may act as, or be integrated into, a functional system or subsystem or the like.

System level products can be employed to carry out numerous applications and in various environments. For example, system level products may include:

(a) computer systems comprising personal computers, work stations, servers, embedded logic controllers, digital data storage, minicomputers, mainframe computers and super computers;

(b) information and entertainment transmission systems comprising telecommunications, satellite, cable, cellular telephones, private branch exchange, telephone switching, and video picture telephones wherein the information may be digitally compressed and forward error corrected;

(c) entertainment systems comprising digital video and audio systems, such as digital analog tape and high definition television, playback devices, display and reproduction means, for example, televisions, cameras, recorders, compact disc players/recorders, digital tape players/recorders and the like;

(d) security and surveillance systems comprising home and business security intrusion, flood and fire systems; vehicle alarms;

(e) information, data acquisition and control systems comprising industrial plant sensors and control means, and control systems utilizing information from the sensors to actuate the control means; and (f) transportation systems comprising airplanes, trains, automobiles, helicopters, rockets, missiles, boats and submarines, and the like, as well as subsystems utilized in the transportation systems, which include positioning systems (for example, global positioning systems), navigational displays and controllers, hazard avoidance systems (such as radar and sonar), fly by wire control systems and engine controlling and monitoring systems.

The above mentioned systems may also be combined to comprise larger and more complex systems that can be utilized to facilitate the infrastructure of a home, business, municipality, government entity, city wide community, state governance, world wide communications, information distribution and security.

In an SCM, a single semiconductor die is packaged and adapted for connection to external systems. This usually involves mounting the die to some sort of substrate, lead frame or carrier, connecting the bond pads on the die to some sort of conductive leads or traces and forming a package body around the die. The conductive leads or traces exit the package body, and usually terminate in external leads, pins or solder balls.

Figure 4:
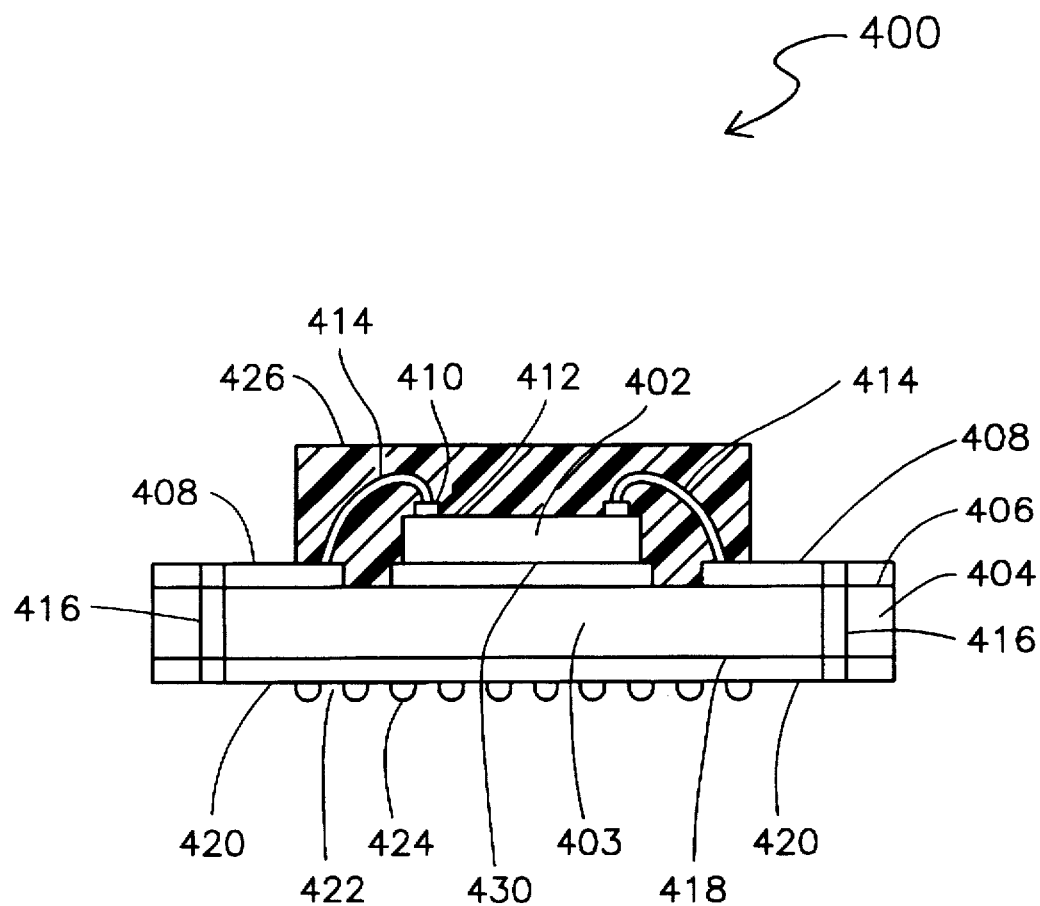
FIG. 4 is a schematic elevational view of a single chip module illustrated in cross section.

Referring to FIG. 4, a schematic elevational view of a SCM is illustrated in cross section. The SCM 400, as illustrated, is a ball bump grid array semiconductor package. A semiconductor die 402 is mounted to the top surface of a central area 403 of a substrate 404. The semiconductor die has conductive lines 412 formed thereon (not illustrated). The top surface 406 of the substrate 404 is provided with a number of conductive traces 408 that extend from near the periphery of the substrate 404 to the central area 403. The die 402 has bond pads 410 thereon. Bond wires 414 extend from the bond pads 410 to inner ends of the traces 408. Near the periphery of the substrate 404, there are plated (conductive) through-holes (vias) 416 extending from the bottom surface 418 of the substrate 404, through the substrate to a respective trace 408. The bottom surface 418 of the substrate is provided with a number of conductive traces 420, each having an end connected with a respective via 416. In this manner, signals (and power) to and from the die are connected through the bond wires 414, through the top side traces 408, through the vias 416, to the bottom side traces 420. Solder balls 424 are attached to the traces 420. A package body 426 is formed over the die 402, and partially covers the top surface of the substrate 404.

Pin grid array semiconductor packages, chip carriers (leaded or leadless), flat packs (such as plastic quad gullwing flat packs), ceramic packages and small outline integrated circuits are also examples of SCMs. Numerous other examples, designs and types of SCMs are known to those of ordinary skill in the art of semiconductor integrated circuit packages.

When two or more semiconductor dies are mounted in the same or separate package body, with or without other electrical components, the resulting assembly is typically referred to as a multi-chip module (MCM).

In order to connect to one of the two or more semiconductor dies of a MCM, a substrate having conductive traces (like substrate 404 of FIG. 4) is often used. Additional components such as capacitors, resistors and inductors may be mounted to the substrate. Often, the interconnections between the various components mounted to the substrate necessitate a large number of conductive traces which need to cross one another. In such cases, it is known to provide a substrate, having alternating layers of insulating material (such as fiberglass, teflon, FR4, BT resin, and the like) and conductive trace patterns (typically formed of metal foils, such as copper). The conductive traces from one layer are typically connected to the conductive traces of another layer by plated through-holes or vias.

Figure 5:
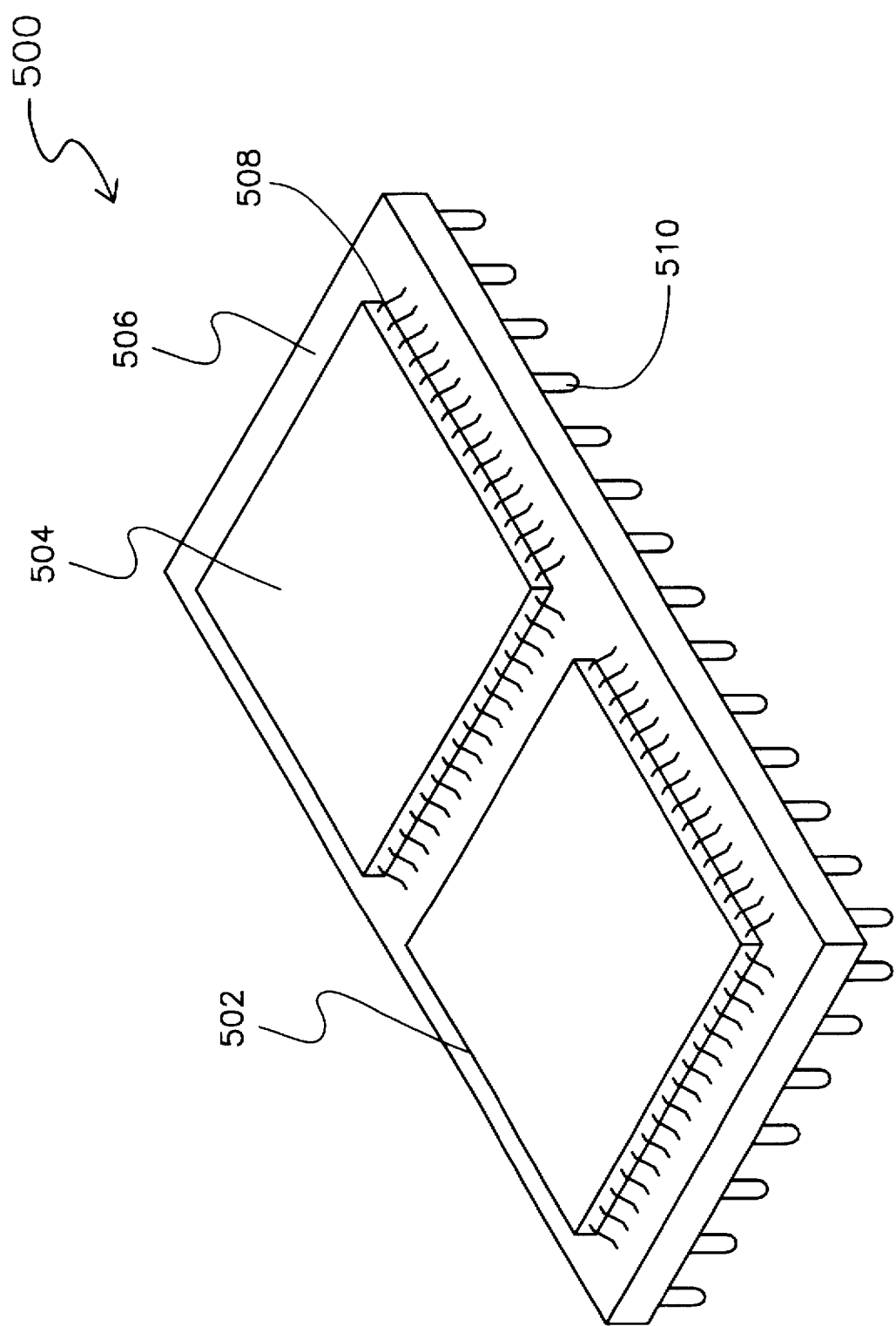
FIG. 5 is a schematic perspective view of a multi-chip module.

FIG. 5 illustrates a schematic perspective view of a MCM. MCM 500 comprises a substrate 506 having conductive lines formed thereon (not illustrated), at least two semiconductor dies 502 and 504 disposed on the substrate 506 and electrically connected to conductive lines (not illustrated) of the substrate 506 by the outer tips of lead frame leads 508. The dies 502 and 504 may be physically mounted to the substrate 506. The two semiconductor dies 502 and 504 are illustrated encapsulated, however, non-encapsulated flip-chip ball bump dies are also contemplated. One or more layers of conductive traces and plated through-holes (not illustrated) may be disposed within substrate 506 and are used to connect the semiconductor dies 502 and 504 to one another and to external connections 510, such as the solder ball bump structures as described above. Additional electrical components, such as capacitors, resistors and inductors (not illustrated) may also be disposed on and connected to the substrate 506. Numerous other examples, designs and types of MCMs are known to those of skill in the art of semiconductor packages.

A BLP typically includes one or more semiconductor devices (such as a single chip module and/or a multi-chip module), in addition to other components, on one or more printed wiring boards.

Figure 6:
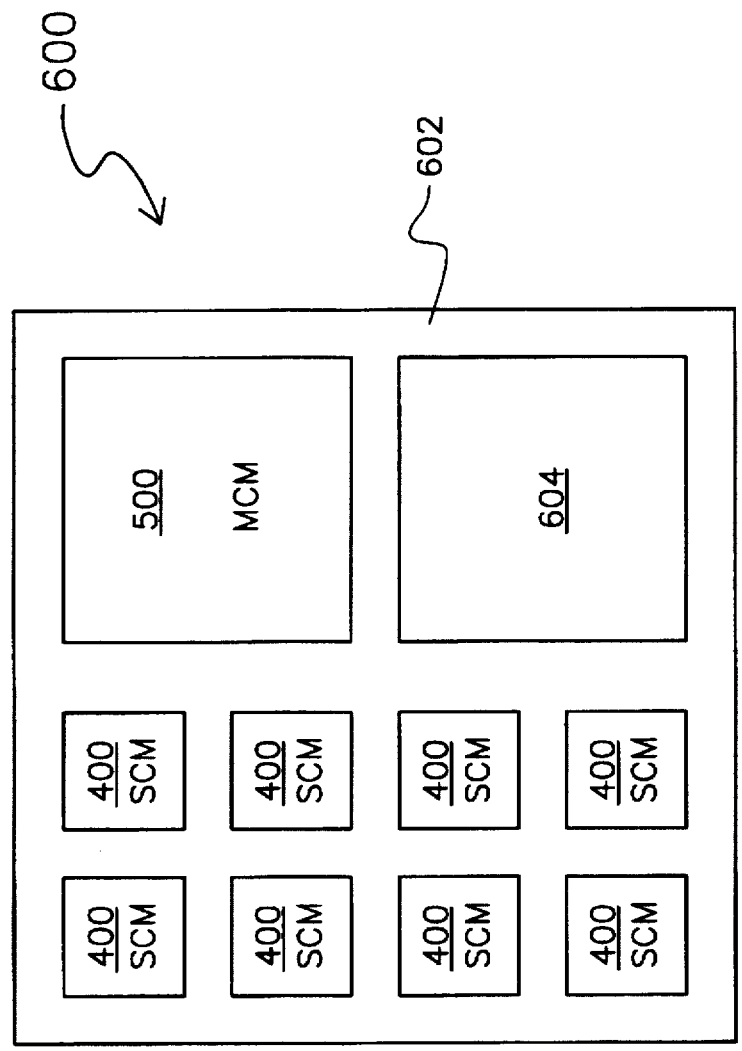
FIG. 6 is a schematic top view of a board level product.

FIG. 6 illustrates a schematic top view of a board level product (BLP). The BLP 600 comprises an array of SCMs 400, a MCM 500, and a memory component 504. The SCMs 400, the MCM 500, and memory 604 are each disposed on and connected to a printed wiring board 602. The printed wiring board 602 provides for all connections between those components. Examples of BLPs include central processing unit boards, memory boards, and interface boards (as are routinely utilized in computer systems).

Boxes are also system level products which may include a combination of SCMs, MCMs, BLPs, and/or other devices. For example, multiple board level products may be connected in parallel with one another by a bus (such as a back plane bus, which is also referred to as a mother board), which communicates signals therebetween. Numerous other examples, designs and types of Boxes are readily apparent to one of ordinary skill in the art. The conductive leads wires exit the boxes, and are usually terminated at external leads or pins.

Figure 7:
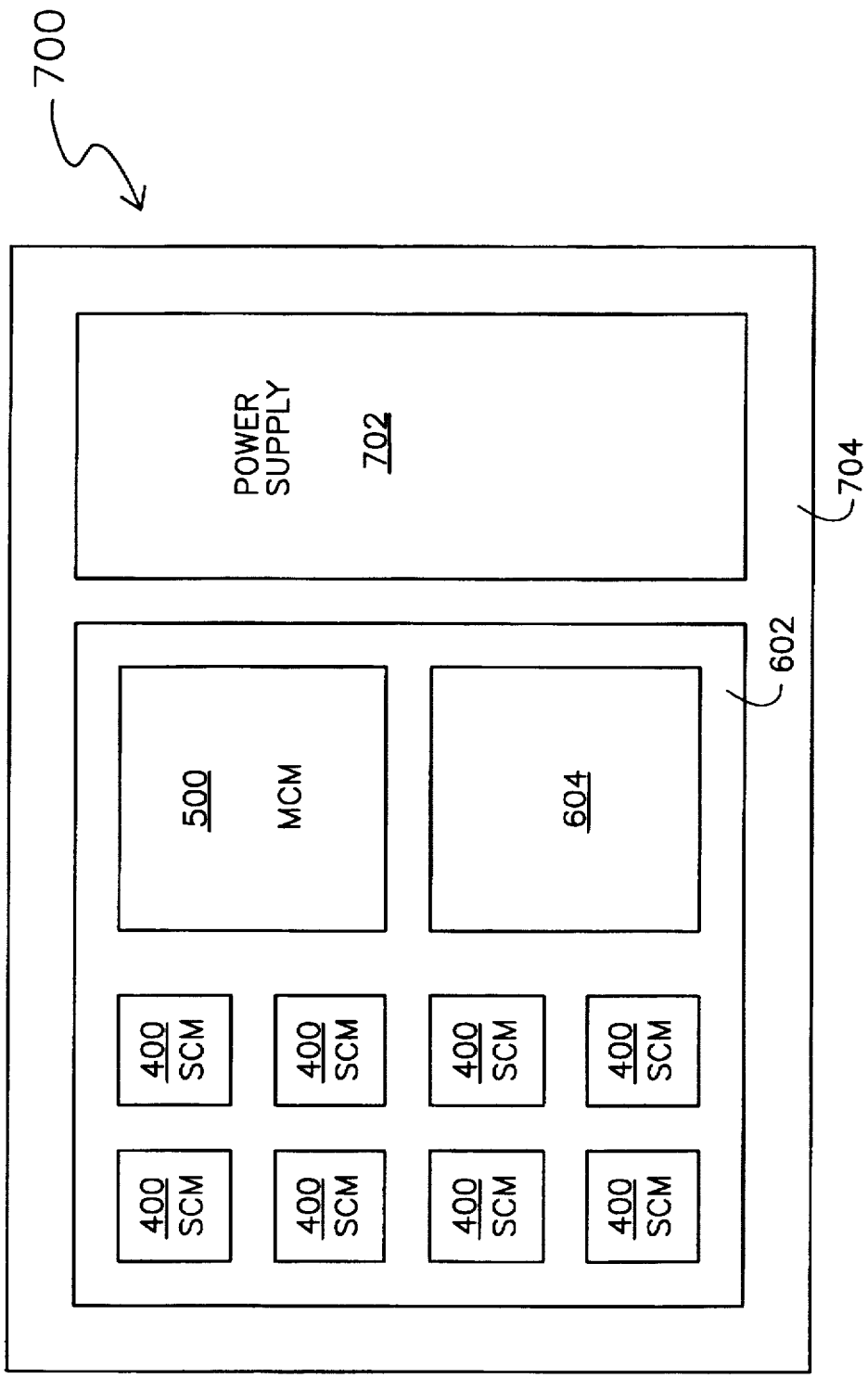
FIG. 7 is a schematic top view of a box level product.

FIG. 7 illustrates a schematic top view of a box level product. The box level product 700 comprises at least one printed wiring board 602 as described above, a power supply 702 and an enclosure or box 704 containing the at least one board 602 and the power supply 702. One or more box level products may be used to create more complex systems according to the present invention.

Figure 8:
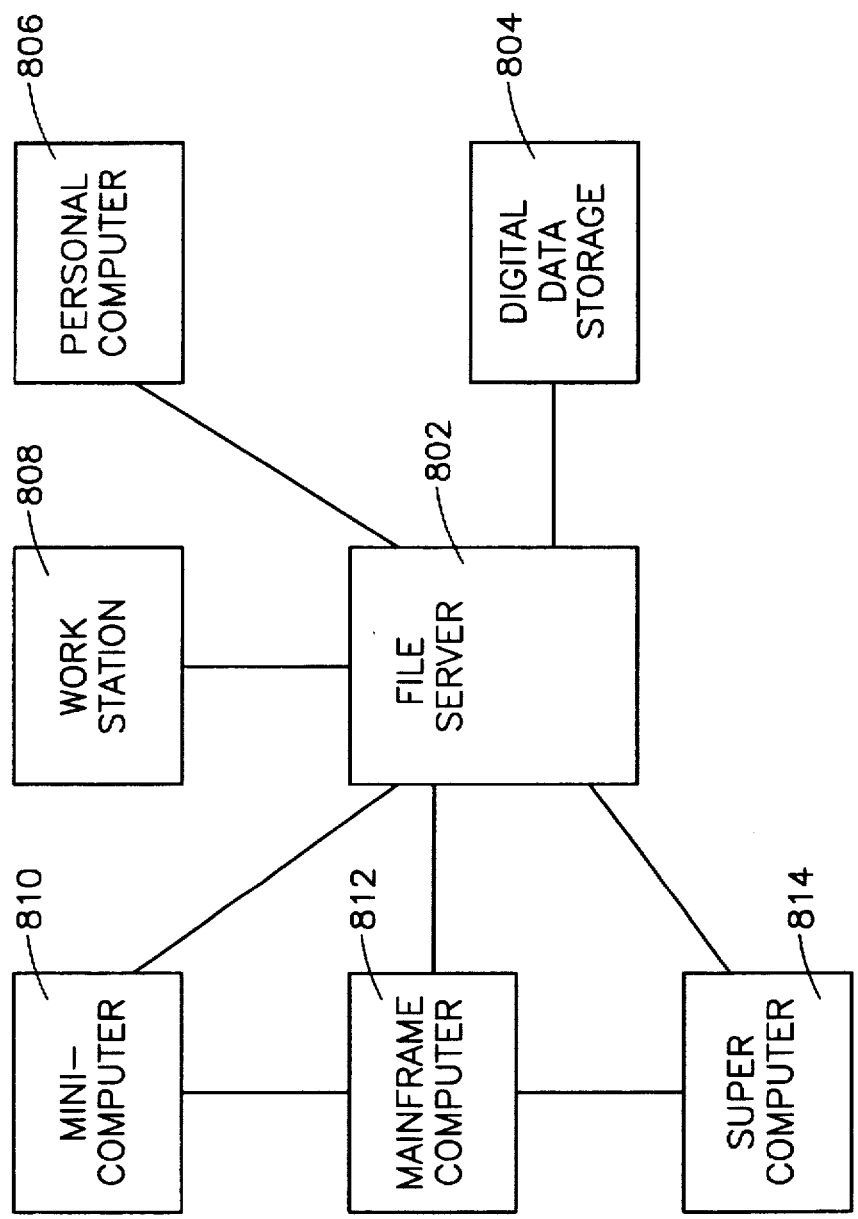
FIG. 8 a schematic block diagram of a computer system.

FIG. 8 illustrates a schematic block diagram of various computer systems interconnected together via various digital data transmission systems. A file server 802 is connected to a digital data storage device 804 such as, for example, magnetic hard disk, tape, optical disk, flash memory, core memory, semiconductor memory and the like. The server 802 may be connected to at least one personal computer 806, a work station 808, a minicomputer 810, a mainframe computer 812, and a super computer 814 through a number of digital data transmission system networks such as token ring, star, coaxial, fiber-optic and the like. These networks may utilize data protocols such as Scaleable Coherent Interface ("SCI"), ANSI/IEEE Std 1596–1992 SCI, Asynchronous Transfer Mode ("ATM"), FiberChannel, SerialBus, SCSI, SSA, QuickRing, HIPPI, FDDI, Ethernet and the like.

Figure 9:
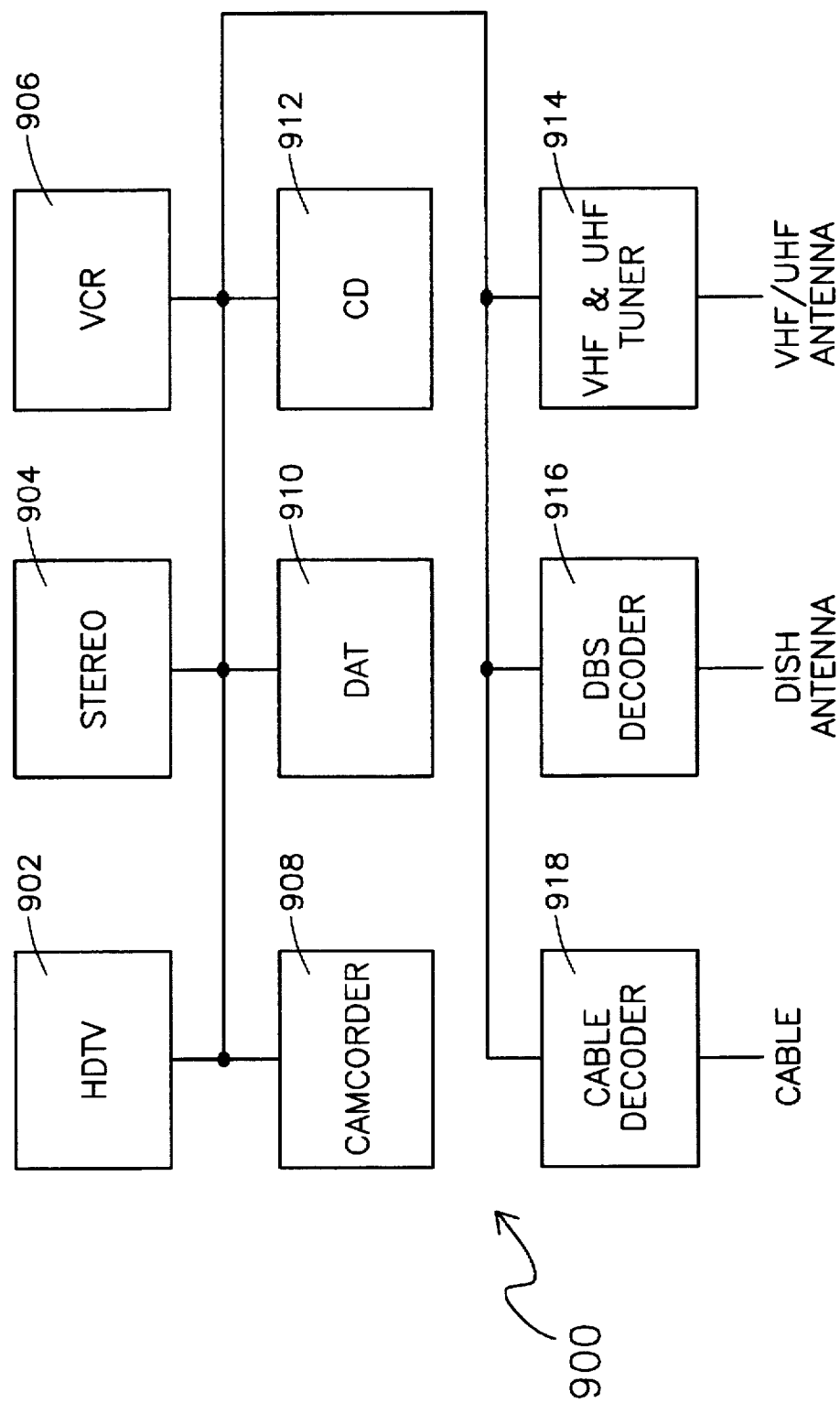
FIG. 9 a schematic block diagram of an entertainment system.

FIG. 9 is a schematic block diagram of an entertainment system according to the present invention. The entertainment system 900 may be comprised of the following component subsystems: a high definition television (HDTV)

902, a stereo 904, a video cassette recorder (VCR) 906, a television camera/recorder (Camcorder) 908, a digital audio tape unit (DAT) 910, a compact disk player (CD) 912, a VHF/UHF tuner 914, a direct broadcast satellite (DBS) decoder 916, and a cable decoder 918. These component subsystems are made up of SCM, MCM, BLP and boxes as disclosed above.

Figure 10:
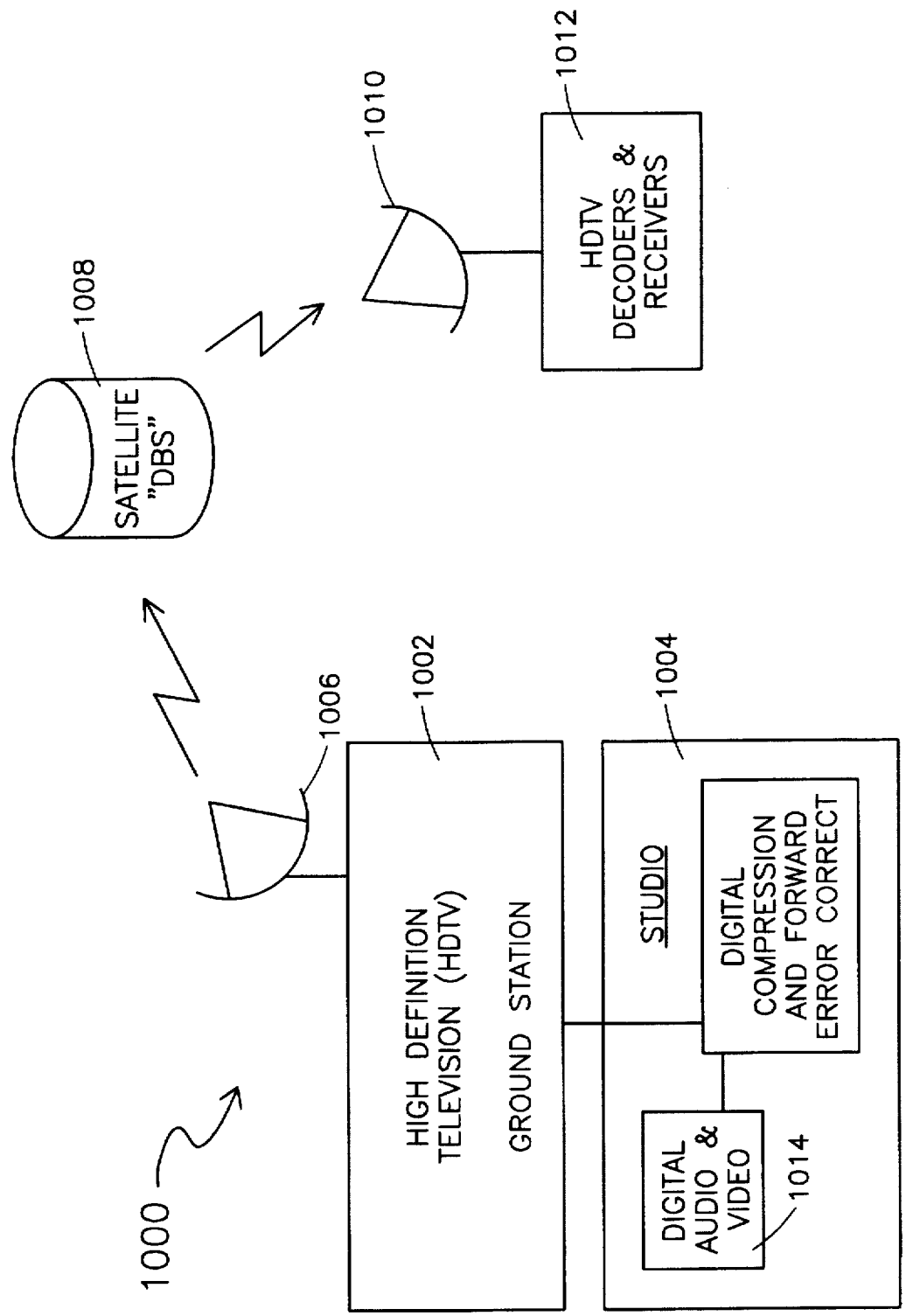
FIG. 10 is a schematic block diagram of an information and entertainment transmission system.

The DBS decoder 916 receives a digitally encoded and forward error corrected signal from a dish antenna (not illustrated) which receives a DBS entertainment signal from a geosynchronous satellite (see FIG. 10). Hardwired cable is connected to the cable decoder 918 which decodes and converts the cable entertainment channels to signals for viewing on the HDTV 902 or a standard television (not illustrated). Standard broadcast television and stereo signals may be received by the VHF/UHF tuner 914 and the base band signals made available to the HDTV 902, stereo 904 and the other recording devices (VCR 906, DAT 910). Similarly, recorded entertainment information may be played on the HDTV 902 and stereo 904 from the playback devices (DAT 910, Camcorder 908, CD 912, VCR 906) for viewing and listening enjoyment by the user.

FIG. 10 is a schematic block diagram of an information and entertainment communications system according to the present invention. The information and entertainment communications system 1000 is comprised of the following systems: A HDTV ground station 1002 which transmits a digitally encoded and forward error corrected signal from the HDTV studio 1004 by microwave dish 1006 to a DBS satellite 1008. The satellite 1008 rebroadcasts the signal from the studio 1004 to a plurality of ground station dish antennas 1010 which are connected to corresponding HDTV receivers/decoders 1012 where the DBS satellite signal is processed and made available, for example, to the entertainment system 900. The system 1000 is comprised of many SCM, MCM, BLP and box level subsystems which greatly benefit from the features, aspects and advantages of the present invention. Some of these subsystems are a digital audio and video formatting subsystem 1014 which convert the analog entertainment information into a digital format, and a digital compression and forward error connection subsystem 1016 which prepares the digitally encoded entertainment information for transmission by the ground station 1002 to the satellite 1008.

Figure 11:
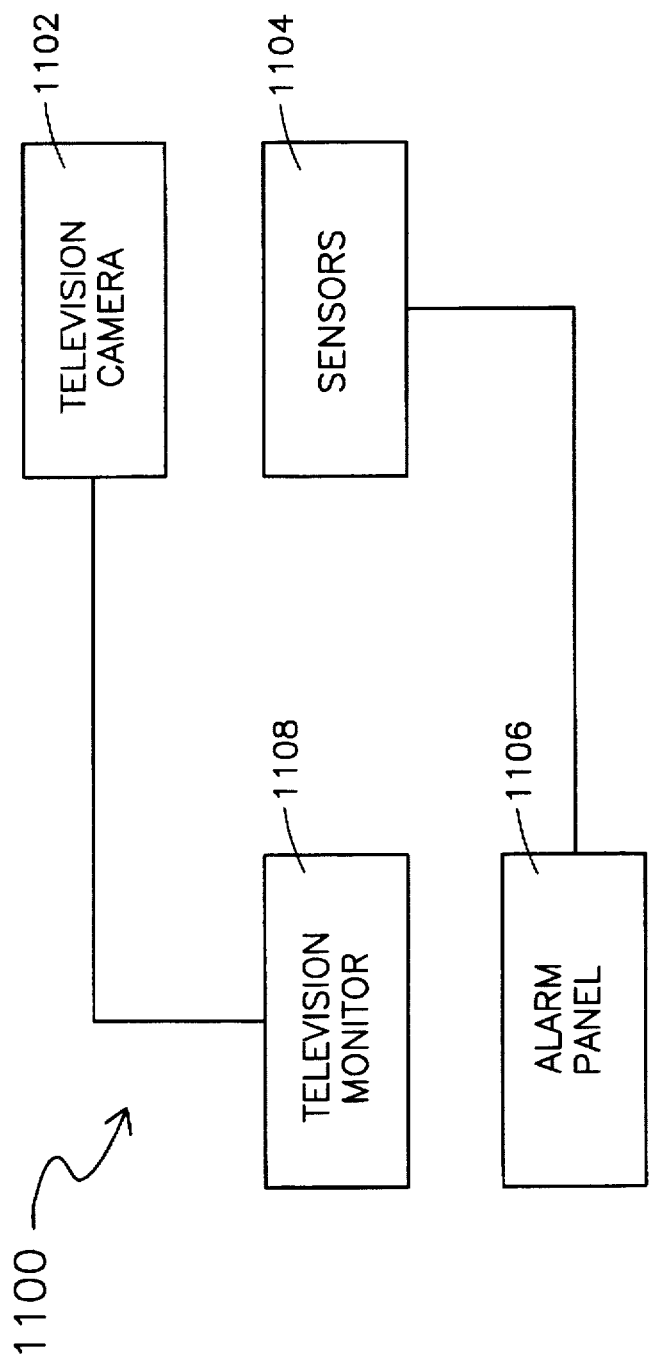
FIG. 11 is a schematic block diagram of a security and surveillance system.

FIG. 11 is a schematic block diagram of a security and surveillance system according to the present invention. The security and surveillance system 1100 is comprised of the following subsystems: A television camera 1102, intrusion detection sensors 1 104, a sensor alarm panel 1106, and a television monitor 1108. The television monitor 1108 displays what the television camera(s) 1102 observe. The alarm panel 1106 displays the status of the sensors 1104 and will annunciate an alert upon a sensed alarm condition. The system 1100 may be utilized in homes, businesses, government building, military bases, prisons and any area requiring security and surveillance.

Figure 13:
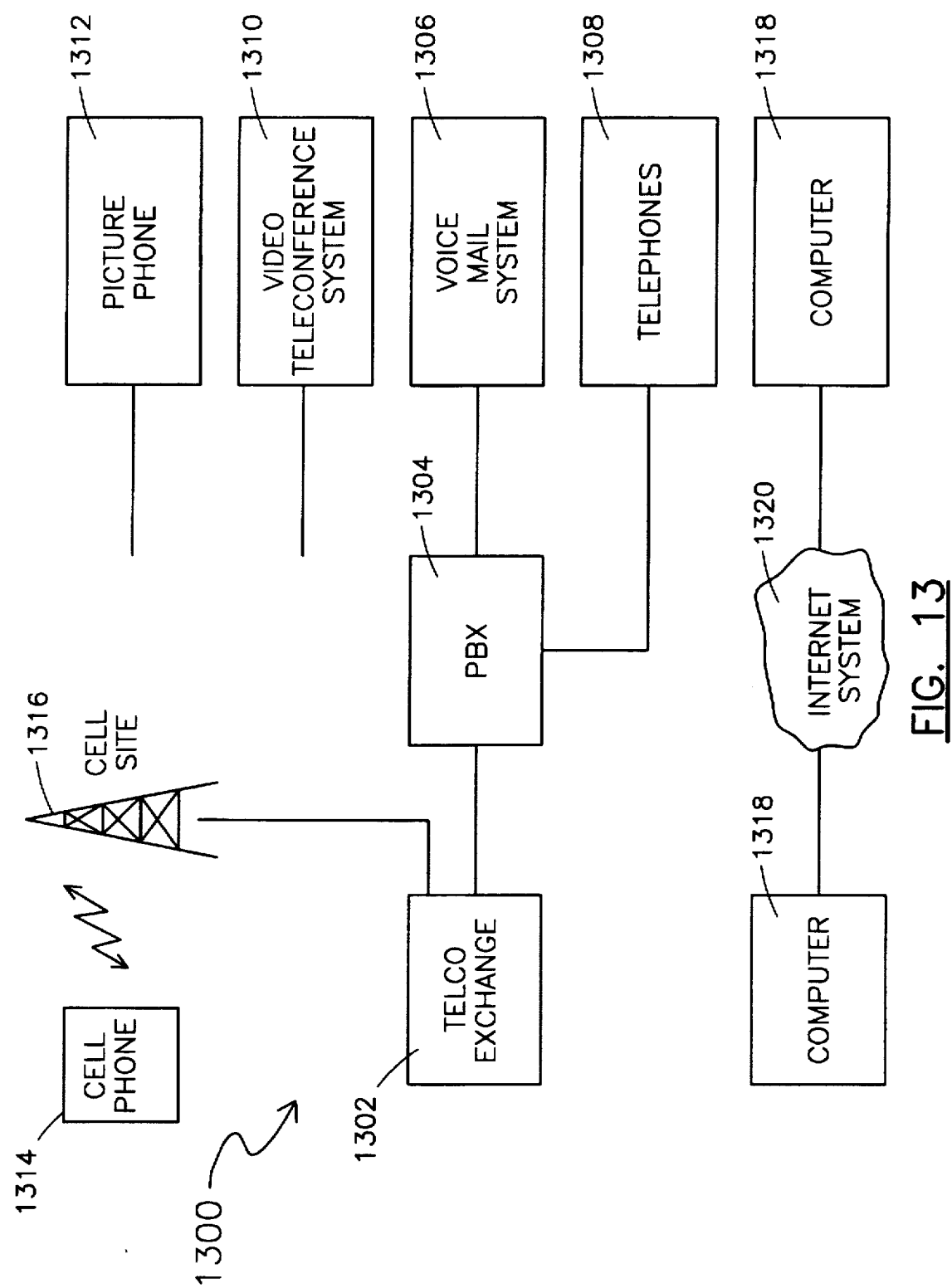
FIG. 13 is a schematic block diagram of a plurality of communications and information transmission system.

In addition, another embodiment of the security and surveillance system 1100 may be utilized to monitor operating conditions of transportation systems such as engine status, hull integrity, operating temperatures, maintenance evaluation and other parameters deemed necessary for the safe and efficient operation of the transportation systems (see FIG. 13). In a further embodiment of to subsystems for the transportation systems, positioning and navigational (GPS) systems may be utilized for hazard avoidance, as well as radar and sonar (see FIG. 13). Further, operation of the transportation systems may be implemented by digital control, such as "fly-by-wire," along with the monitoring thereof The system 1100 and its subsystems may be utilized with the other system embodiments disclosed herein and will greatly benefit from the features, aspects and advantages of invention as disclosed hereinabove.

Figure 12:
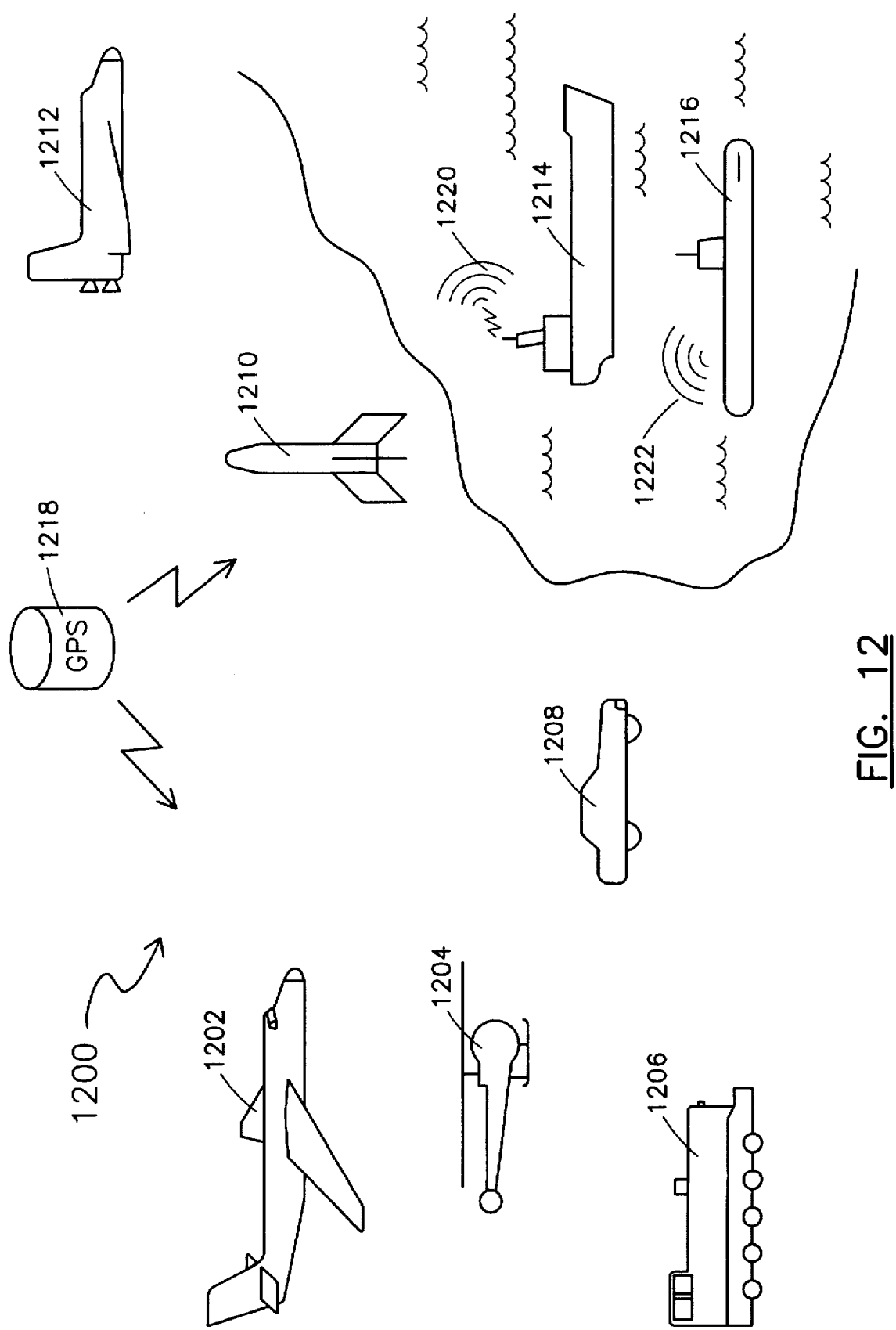
FIG. 12 is a schematic block diagram of a plurality of transportation systems.

FIG. 12 is a schematic block diagram of a plurality of transportation systems according to the present invention. The transportation systems, generally referenced to by the numeral 1200, may utilize, individually or in combination, the aforementioned systems to great advantage. Embodiments of the transportation system 1200 is as follows: An airplane 1202, a helicopter 1204, a train 1206, a vehicle 1208 such as an automobile or truck, a rocket 1210, a space shuttle 1212, a ship 1214, a submarine 1216, and the like. Each of the embodiments of the transportation systems 1200 contemplated herein may greatly benefit from the communications, navigation and control systems disclosed herein along with he features, aspects and advantages of the present invention.

Each of the embodiments of the transportation systems 1200 may utilize a positioning and navigation system which derives its position information from a global positioning satellite system (GPS) 1218. The positioning and navigation system is comprised of SCM, MCM, BLP and box level systems as discussed hereinabove. Radar 1220 and/or sonar 1222 systems may be utilized for collision avoidance and location and may be incorporated with any of the transportation systems 1200.

FIG. 13 is a schematic block diagram of a plurality of communications and information transmission systems according to the present invention. The communications and information transmission systems 1300 may comprise, individually or in combination, a telephone exchange 1302, a PBX 1304, a voice mail system 1306, telephones 1308, a video teleconferencing system 1310, a video picture telephone 1312 and the like. The systems 1300 may also comprise a cellular telephone 1314, and a plurality of cell sites 1316 which may be connected with the telephone system 1302. Further, systems 1300 may be computers 1318 connected together through the internet system 1320. Both analog and digital communications are contemplated herein with the various features, advantages and aspects of the present invention.

Other MCM, SCM, mini-board, micro-board, board level and other system sub-assemblies are contemplated using the heat dissipation techniques of the present invention. Additionally, such sub-assemblies or packages using such heat dissipation techniques may be used in traditional circuit boards or sub-assemblies for a system level product. Examples of electronic systems that may benefit from the system and method of the present invention have been mentioned above. The spirit and intent of the present invention is to efficiently dissipate heat from all electronic systems from a single semiconductor integrated circuit die to a complex multiple box electronic system.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to particularly preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An electronic system having at least one packaged semiconductor device that is independent of the positional orientation of the device and gravity, said system comprising:

a semiconductor device package having top and bottom portions creating a cavity in which a die-receiving area is formed therein;

conductive leads having first ends outside the device package and second ends inside the device package die-receiving area;

at least one semiconductor die having top and bottom surfaces and located within the die-receiving area;

the at least one semiconductor die connected to the second ends of the conductive leads inside the device package die-receiving area;

a first wick having a first portion thereof proximate to the top surface of the at least one die and in thermal communication therewith, the first wick having a second portion thereof in the top portion of the package body;

a second wick having a first portion thereof proximate to the bottom surface of the at least one die and in thermal communication therewith, the second wick having a second portion thereof in the bottom portion of the package body; and an evaporative coolant at least partially filling the cavity formed by the top and bottom portions of the package body, wherein the evaporative coolant evaporates from the first portions of the first and second wicks proximate to the top and bottom surfaces, respectively, of the at least one semiconductor die, the evaporated coolant then condenses at the top and bottom portions of the package body and flows through the second portions of the first and second wicks to the first portions of the first and second wicks proximate to the top and bottom surfaces, respectively, of the at least one semiconductor die.

2. The system of claim 1, wherein the heat pipe is pre-fabricated and is inserted into a hole in the semiconductor device package.

3. The system of claim 1, wherein the semiconductor device package material is epoxy.

4. The system of claim 1, wherein the semiconductor device package material is plastic.

5. The system of claim 1, wherein the semiconductor device package is an M-Quad type package.

6. The system of claim 1, further comprising a water-impermeable coating on the at least one semiconductor die.

7. The system of claim 1, wherein the inorganic dielectric coating is silicon dioxide.

8. The system of claim 1, wherein the electronic system is a single chip module.

9. The system of claim 1, wherein the electronic system is a multi-chip module having at least one semiconductor device.

10. The system of claim 1, wherein the electronic system is a board level product having a plurality of semiconductor devices on at least one printed wiring board.

11. The system of claim 1, wherein the electronic system is a box level system having a plurality of semiconductor devices on at least one printed wiring board mounted into a box with a power source.

12. The system of claim 1, wherein the electronic system is a computer system.

13. The system of claim 1, wherein the electronic system is an information and entertainment transmission system.

14. The system of claim 1, wherein the electronic system is an entertainment system.

15. The system of claim 1, wherein the electronic system is a security and surveillance system.

16. The system of claim 1, wherein the electronic system is an information, data acquisition and control system.

17. The system of claim 1, wherein the electronic system is utilized in a transportation system.

18. The semiconductor device assembly according to claim 1, further comprising an inorganic dielectric coating over portions of the conductive leads inside the semiconductor device package and over the top and bottom surfaces of the at least one semiconductor die.

19. The system of claim 1, further comprising:

a first heat sink in thermal communication with the top portion of the package body; and a second heat sink in thermal communication with the bottom portion of the package body.

20. The system of claim 1, further comprising:

a first heat pipe in the top portion of the package body, wherein the first wick extends into the first heat pipe; and a second heat pipe in the bottom portion of the package body, wherein the second wick extends into the second heat pipe.

21. The system of claim 20, further comprising:

a first heat sink proximate to the first heat pipe and in thermal communication therewith; and a second heat sink proximate to the second heat pipe and in thermal communication therewith.

* * * * *